United States Patent
Lee et al.

(10) Patent No.: US 10,908,756 B2
(45) Date of Patent: Feb. 2, 2021

(54) FORCE SENSOR AND DISPLAY DEVICE INCLUDING THE SAME

(71) Applicant: Samsung Display Co., Ltd., Yongin-si (KR)

(72) Inventors: Kang Won Lee, Seoul (KR); Choon Hyop Lee, Anyang-si (KR); Seung Hwan Chung, Seongnam-si (KR); Sang Chul Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 12 days.

(21) Appl. No.: 16/217,960

(22) Filed: Dec. 12, 2018

(65) Prior Publication Data

US 2020/0033971 A1 Jan. 30, 2020

(30) Foreign Application Priority Data

Jul. 27, 2018 (KR) .......................... 10-2018-0088130

(51) Int. Cl.
*G06F 3/045* (2006.01)
(52) U.S. Cl.
CPC .................................... *G06F 3/045* (2013.01)
(58) Field of Classification Search
CPC .... G06F 3/045; G06F 3/0414; G06F 3/04142; G06F 3/04144; G06F 2203/04105; G06F 2203/04113
See application file for complete search history.

(56) References Cited

U.S. PATENT DOCUMENTS

| | | | | |
|---|---|---|---|---|
| 9,881,577 | B2 * | 1/2018 | Wang | G06F 3/044 |
| 2014/0062933 | A1 * | 3/2014 | Coulson | G06F 3/044 |
| | | | | 345/174 |
| 2015/0084909 | A1 * | 3/2015 | Worfolk | G06F 3/0414 |
| | | | | 345/174 |
| 2017/0003782 | A1 * | 1/2017 | Heo | G06F 3/044 |
| 2017/0068368 | A1 * | 3/2017 | Hsiao | G06F 3/0416 |
| 2017/0177160 | A1 * | 6/2017 | Oh | G06F 3/045 |
| 2018/0011581 | A1 * | 1/2018 | Kim | G06F 3/0414 |
| 2018/0299997 | A1 * | 10/2018 | Isaacson | G06F 3/045 |
| 2019/0332218 | A1 | 10/2019 | Lee et al. | |

FOREIGN PATENT DOCUMENTS

JP 5384698 B2 10/2013
KR 10-2016-0149982 A 12/2016

* cited by examiner

*Primary Examiner* — Kenneth Bukowski
(74) *Attorney, Agent, or Firm* — Lewis Roca Rothgerber Christie LLP

(57) ABSTRACT

A force sensor, includes: a first substrate and a second substrate; a first driving electrode, a second driving electrode, a first sensing electrode, and a second sensing electrode on one surface of the first substrate facing the second substrate; a first force sensing layer on one surface of the second substrate facing the first substrate; and a second force sensing layer contacting the second driving electrode and the second sensing electrode, wherein the first force sensing layer overlaps the first driving electrode and the first sensing electrode, and gaps exist between the first force sensing layer and the first driving electrode and between the first force sensing layer and the first sensing electrode.

20 Claims, 27 Drawing Sheets

FORCE SENSOR AND DISPLAY DEVICE INCLUDING THE SAME

CROSS-REFERENCE TO RELATED APPLICATION

This application claims priority to and the benefit of Korean Patent Application No. 10-2018-0088130 filed on Jul. 27, 2018 in the Korean Intellectual Property Office, the disclosure of which is incorporated herein by reference in its entirety.

BACKGROUND

1. Field

Aspects of some example embodiments of the present invention relate to a force sensor and a display device including the same.

2. Description of the Related Art

A display device for displaying an image is used for various electronic appliances for providing an image to a user, such as smart phones, tablet PCs, digital cameras, notebook computers, navigators, and televisions. The display device includes a display panel for generating and displaying an image, and various input devices.

In the fields of smart phones and tablet PCs, a touch panel recognizing a touch input may be utilized with a display device. The touch panel may be utilized, for example, to replace the alternative physical input devices such as keypads because of the convenience of touching.

User inputs may also be detected by mounting a force sensor in addition to a touch panel on a display device. The resistance value sensed by the force sensor changes depending on the force pressed by a user (e.g., 100kΩ or more, which is very large, and 20kΩ or less, which is very small, when the force pressed by the user is weak). Thus, a force sensing unit has a wide range for sensing the resistance value of the force sensor.

The above information disclosed in this Background section is only for enhancement of understanding of the background of the invention and therefore it may contain information that does not constitute prior art.

SUMMARY

Accordingly, aspects of some example embodiments of the present invention may include a force sensor capable of reducing a resistance value sensing range of a force sensing unit.

Aspects of some example embodiments of the present invention may further include a display device including a force sensor capable of reducing a resistance value sensing range of a force sensing unit.

According to some example embodiments of the present disclosure, a force sensor includes: a first substrate and a second substrate; a first driving electrode, a second driving electrode, a first sensing electrode, and a second sensing electrode, on one surface of the first substrate facing the second substrate; a first force sensing layer on one surface of the second substrate facing the first substrate; and a second force sensing layer contacting the second driving electrode and the second sensing electrode, wherein the first force sensing layer overlaps the first driving electrode and the first sensing electrode, and gaps exist between the first force sensing layer and the first driving electrode and between the first force sensing layer and the first sensing electrode.

According to some example embodiments of the present disclosure, a display device includes: a display panel; and a force sensor under the display panel, wherein the force sensor comprises: a first substrate and a second substrate; a first driving electrode, a second driving electrode, a first sensing electrode, and a second sensing electrode, on one surface of the first substrate facing the second substrate; a first force sensing layer on one surface of the second substrate facing the first substrate; and a second force sensing layer contacting the second driving electrode and the second sensing electrode, wherein the first force sensing layer overlaps the first driving electrode and the first sensing electrode, and gaps exist between the first force sensing layer and the first driving electrode and between the first force sensing layer and the first sensing electrode.

However, aspects of the present invention are not restricted to the features set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present invention will become more apparent by describing in more detail aspects of some example embodiments thereof with reference to the attached drawings, in which.

DETAILED DESCRIPTION

Aspects of some example embodiments of the present invention will now be described more fully hereinafter with reference to the accompanying drawings, in which aspects of some example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, embodiments of the present invention will be described with reference to the attached drawings.

Figure 1:
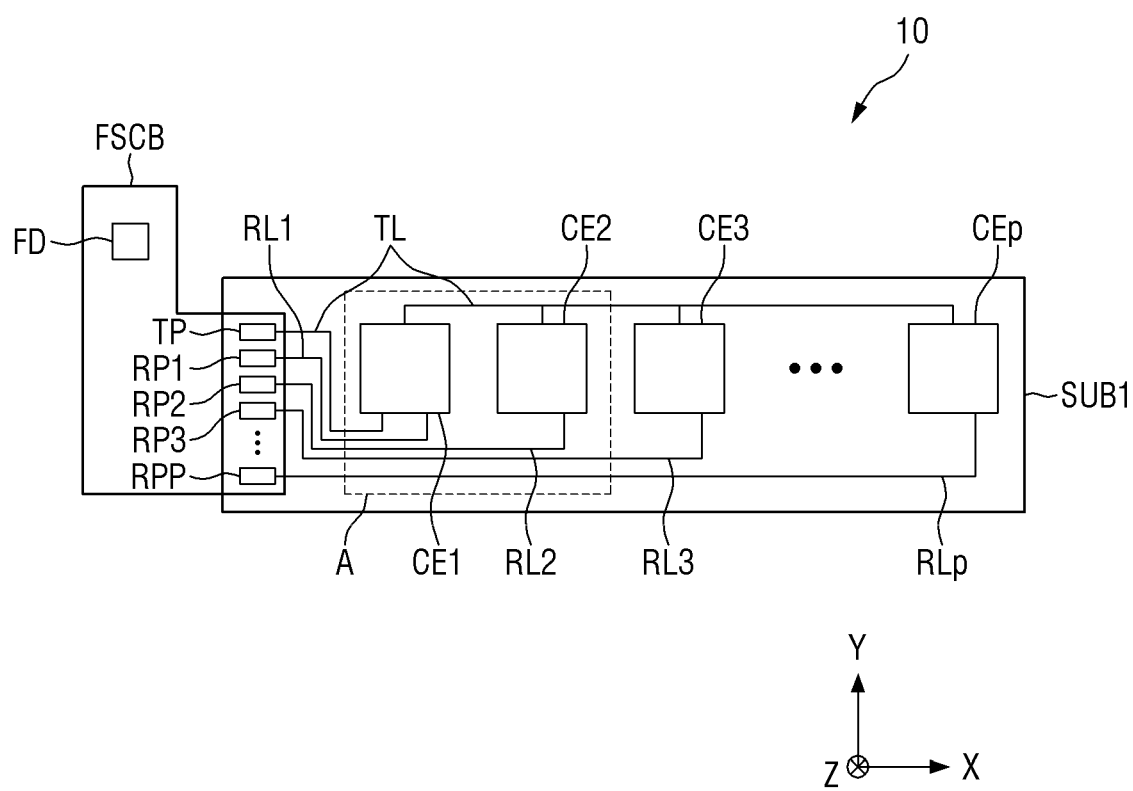
FIG. 1 is a plan view of a force sensor according to some example embodiments.

FIG. 1 is a plan view of a force sensor according to some example embodiments.

Referring to FIGS. 1, 2, 3A, and 3B, a force sensor 10 may have a shape extending in one direction, for example, an X-axis direction in a plan view. In this case, the length of the force sensor 10 in the extending direction (e.g., along the X-axis) may be larger than the width (e.g., along the Y-axis) thereof. However, the shape of the force sensor 10 is not limited thereto, and may be changed depending on the applied position.

The force sensor 10 includes a first substrate SUB1, a second substrate SUB2, a driving line TL, first to p-th sensing lines RL1 to RLp (p is an integer of 2 or more), a driving pad TP, first to p-th sensing pads RP1 to RPp, and force sensing layers CE1 to CEp.

The first substrate SUB1 and the second substrate SUB2 are arranged to face each other. Each of the first substrate SUB1 and the second substrate SUB2 may include polyethylene, polyimide, polycarbonate, polsulfone, polyacrylate, polystyrene, polyvinyl chloride, polyvinyl alcohol, polynorbonene, or polyester. In an embodiment, each of the first substrate SUB1 and the second substrate SUB2 may be formed of a polyethylene terephthalate (PET) film or a polyimide film.

The force sensing layers CE1 to CEp are arranged between the first substrate SUB1 and the second substrate SUB2. The driving line TL, the first to p-th sensing lines RL1 to RLp, the driving pad TP, and the first to p-th sensing pads RP1 to RPp are arranged on the first substrate SUB1 facing the second substrate SUB2. The force sensing layers CE1 to CEp are arranged between the first substrate SUB1 and the second substrate SUB2.

Each of the force sensing layers CE1 to CEp may independently sense the applied force at the corresponding position. Although it is illustrated in FIG. 1 that the force sensing layers CE1 to CEp are arranged in one row, example embodiments of the present invention are not limited thereto. The respective force sensing layers CE1 to Cep may be arranged to be spaced apart from each other at intervals (e.g., predetermined intervals) as shown in FIG. 1, or may be arranged continuously.

Figure 26:
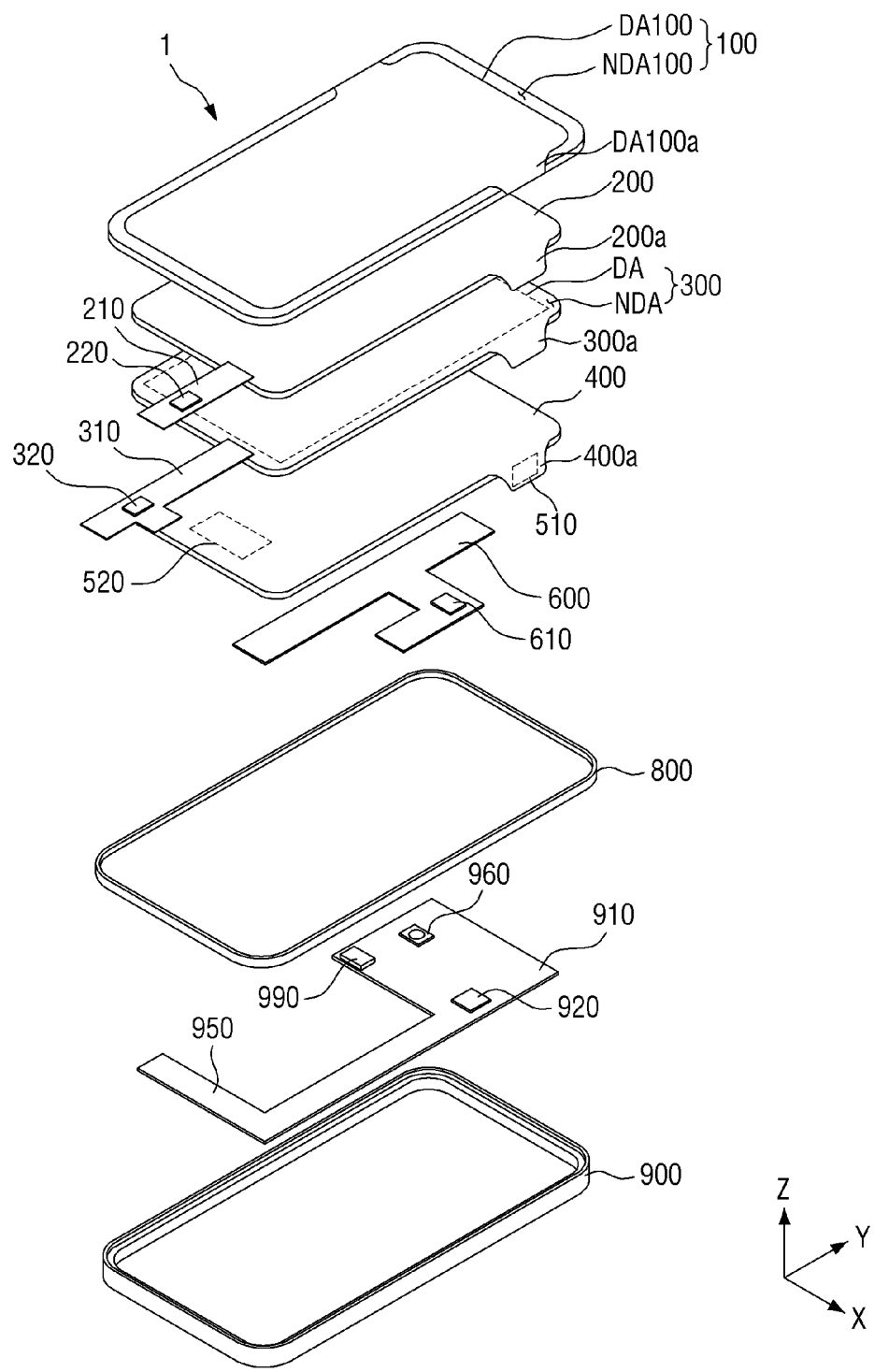
FIG. 26 is an exploded perspective view of the display device of FIG. 25.

The force sensing layers CE1 to CEp may have different areas depending on the application. For example, when the force sensing layers CE1 to CEp are used as a substitute of a physical button substitute, such as a volume control button located on the side surface of the display device 1 (e.g., as shown in FIG. 26), the force sensing layers CE1 to CEp may be formed to have similar areas to the physical button. Further, when the force sensing layers CE1 to CEp are used to sense the force applied to the front surface of the display device 1 (e.g., as shown in FIG. 26), the force sensing layers CE1 to CEp may be formed to have a size corresponding to a force sensing area.

Each of the force sensing layers CE1 to CEp may be connected to at least one driving line and at least one sensing line. For example, as shown in FIG. 1, the force sensing layers CE1 to CEp may be commonly connected to one driving line TL, whereas they may be connected one-to-one to the sensing lines RL1 to RLp. The first force sensing layer. The first force sensing layer CE1 may be connected to the driving line TL and the first sensing line RL1, and the second force sensing layer CE2 may be connected to the driving line TL and the second sensing line RL2. Further, the third force sensing layer CE3 may be connected to the driving line TL and the third sensing line RL3, and the p-th force sensing layer CEp may be connected to the driving line TL and the p-th sensing line RLp.

The driving line TL may be connected to the driving pad TP, and the first to p-th sensing lines RL1 to RLp may be connected one to one to the first to p-th sensing pads RP1 to RPp. The first sensing line RL1 may be connected to the first sensing pad RP1, the second sensing line RL2 may be connected to the second sensing pad RP2, the third sensing line RL3 may be connected to the third sensing pad RP3, and the p-th sensing line RLp may be connected to the p-th sensing pad RPp. The driving pad TP and the first to p-th sensing lines RL1 to RLp may be located at one side of the first substrate SUB1, and may be connected to a force sensing circuit board FSCB through an anisotropic conductive film.

The force sensing circuit board FSCB may include a force sensing unit FD. The force sensing unit FD applies a driving voltage to the driving line TL through the driving pad TP, and senses current values or voltage values from the sensing lines RL1 to RLp through the sensing lines RL1 to RLp, thereby sensing the force applied to the force sensing layers CE1 to CEp. The force sensing unit FD may be mounted on the force sensing circuit board FSCB or on another circuit board connected to the forcesensing circuit board FSCB. When the force sensing unit FD is mounted on another circuit board connected to the force sensing circuit board FSCB, the force sensing unit FD may be integrated with a driving unit having a different function. For example, the force sensing unit FD may be integrated with a touch driving unit 220 of a touch circuit board 210 (e.g., as shown in FIG. 26).

The force sensor 10 may further include a bonding layer located between the first substrate SUB1 and the second substrate SUB2 to bond the first substrate SUB1 and the second substrate SUB2 to each other. The bonding layer may be a pressure-sensitive adhesive layer or an adhesive layer. The bonding layer may be located along the periphery of the first substrate SUB1 and the second substrate SUB2. In an embodiment, the bonding layer may serve to encapsulate the inside of the force sensor 10 by completely surrounding the edges of the first substrate SUB1 and the second substrate SUB2. Moreover, the bonding layer may serve as a spacer that maintains a constant distance between the first substrate SUB1 and the second substrate SUB2. The bonding layer may not overlap the driving line TL, the sensing lines RL1 to RLp, the force sensing layers CE1 to CEp, the driving pad TP, and the sensing pads RP1 to RPp.

The bonding layer may be first attached to one surface of the first substrate SUB1 or one surface of the second substrate SUB2, and then attached to one surface of the other substrate in the process of attaching the first substrate SUB1 and the second substrate SUB2. As another example, bonding layers may be respectively provided on one surface of the first substrate SUB1 and one surface of the second substrate SUB2, and then the bonding layer of the first substrate SUB1 and the bonding layer of the second substrate SUB2 may be attached to each other in the process of attaching the first substrate SUB1 and the second substrate SUB2.

Each of the force sensing layers CE1 to CEp includes a driving connection electrode TCE, a sensing connection electrode RCE, a first driving electrode TE1, a first sensing electrode RE1, and a first force sensing layer PSL1.

The driving connection electrode TCE, the sensing connection electrode RCE, the first driving electrode TE1, and the first sensing electrode RE1 are located on the first substrate SUB1 facing the second substrate SUB2.

The driving connection electrode TCE is connected to the driving line TL and the first driving electrode TE1. For example, the driving connection electrode TCE is connected to the driving line TL at both ends in the length direction (Y-axis direction). The first driving electrodes TE1 may be branched in the width direction (X-axis direction) of the driving connection electrode TCE.

The sensing connection electrode RCE is connected to any one of the sensing lines RL1 to RLp and the first sensing electrode RE1. For example, the sensing connection electrode TCE is connected to any one of the sensing lines RL1 to RLp at one end in the length direction (Y-axis direction). The first sensing electrodes RE1 may be branched in the width direction (X-axis direction) of the sensing connection electrode RCE.

The first driving electrode TE1 and the first sensing electrode RE1 may be located on the same layer. The first driving electrode TE1 and the first sensing electrode RE1 may be made of the same material. For example, the first driving electrode TE1 and the first sensing electrode RE1 may include a conductive material such as silver (Ag) or copper (Cu). The first driving electrode TE1 and the first sensing electrode RE1 may be formed on the first substrate SUB1 by a screen printing method.

The first driving electrodes TE1 and the first sensing electrodes RE1 are located adjacent to each other, but are not connected to each other. The first driving electrodes TE1 and the first sensing electrodes RE1 may be arranged in parallel with each other. The first driving electrodes TE1 and the first sensing electrodes RE1 may be alternately arranged in the length direction (Y-axis direction) of the driving connection electrode TCE and the sensing connection electrode RCE. That is, the first driving electrode TE1, the first sensing electrode RE1, the first driving electrode TE1, and the first sensing electrode RE1 may be repeatedly arranged in this order in the length direction (Y-axis direction) of the driving connection electrode TCE and the sensing connection electrode RCE.

The first force sensing layer PSL1 is located on one surface of the second substrate SUB2 facing the first substrate SUB1. The first force sensing layer PSL1 may be located to overlap the first driving electrodes TE1 and the first sensing electrodes RE1.

The first force sensing layer PSL1 may include a pressure-sensitive material and a polymer resin in which the pressure-sensitive material is provided. The pressure sensitive material may include fine metal particles (or metal nanoparticles) of nickel, aluminum, titanium, tin, or copper. For example, the first force sensing layer PSL1 may be a quantum tunneling composite (QTC).

Figure 3A:
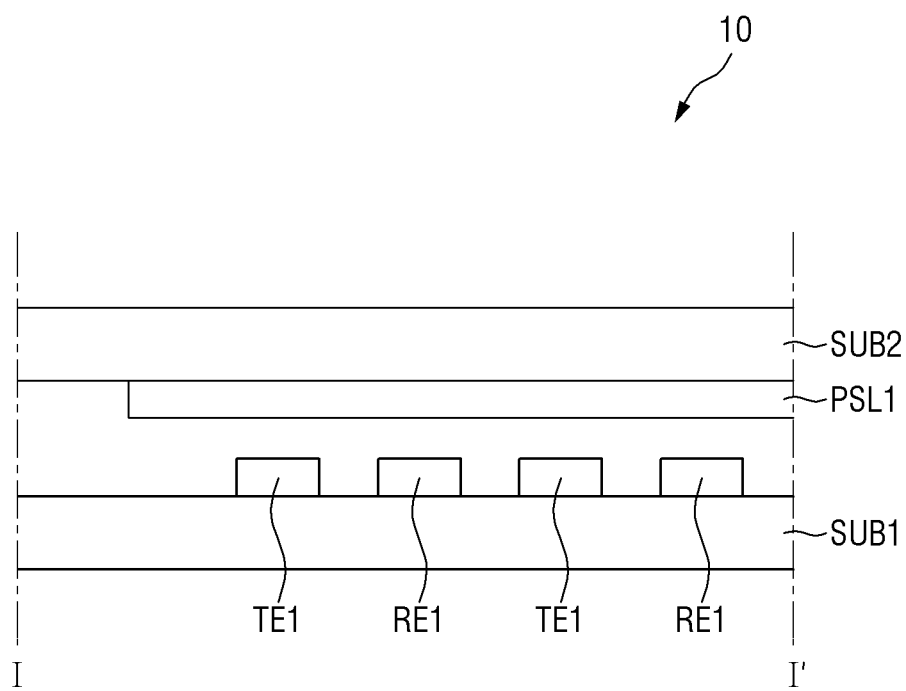
FIGS. 3A and 3B are cross-sectional views taken along the line I-I' when a user does not press a force sensor by hand and when the user presses the force sensor by hand.

When a force is not applied to the second substrate SUB2 in the height direction (Z-axis direction) of the force sensor 10, as shown in FIG. 3A, gaps exist between the first force sensing layer PSL1 and the first driving electrodes TE1 and between the first force sensing layer PSL1 and the first sensing electrodes RE1. That is, when a force is not applied to the second substrate SUB2, the first force sensing layer PSL1 is spaced apart from the first driving electrodes TE1 and the first sensing electrodes RE1.

Figure 3B:
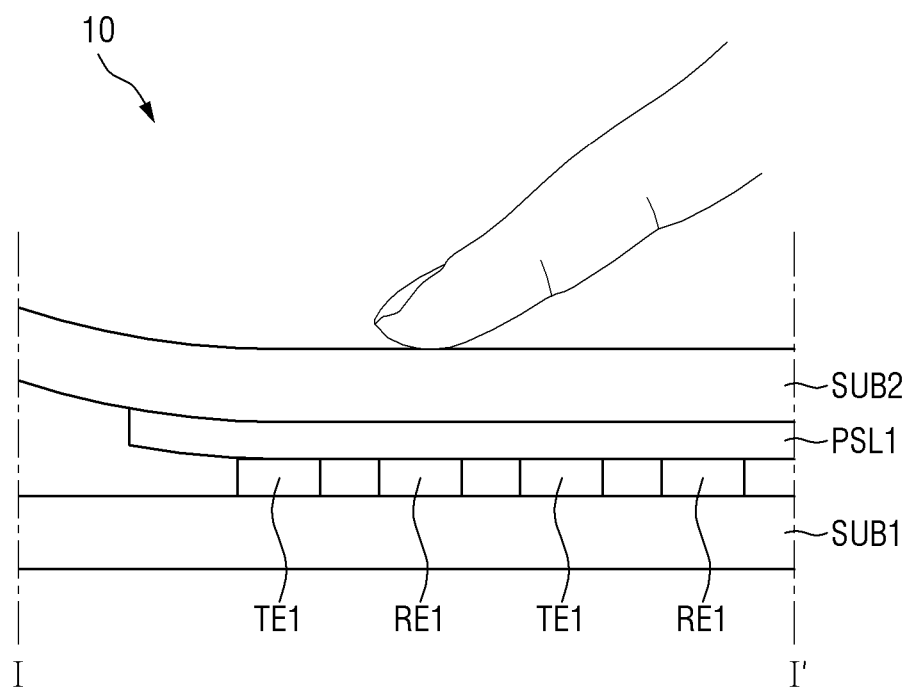

When a force is applied to the second substrate SUB2 in the height direction (Z-axis direction) of the force sensor 10, as shown in FIG. 3B, the first force sensing layer PSL1 is brought into contact with the first driving electrodes TE1 and the first sensing electrodes RE1. Accordingly, the first driving electrode TE1 and the first sensing electrode RE1 may be physically connected through the first force sensing layer PSL1, and the first force sensing layer PSL1 may serve as an electrical resistance.

Figure 4:
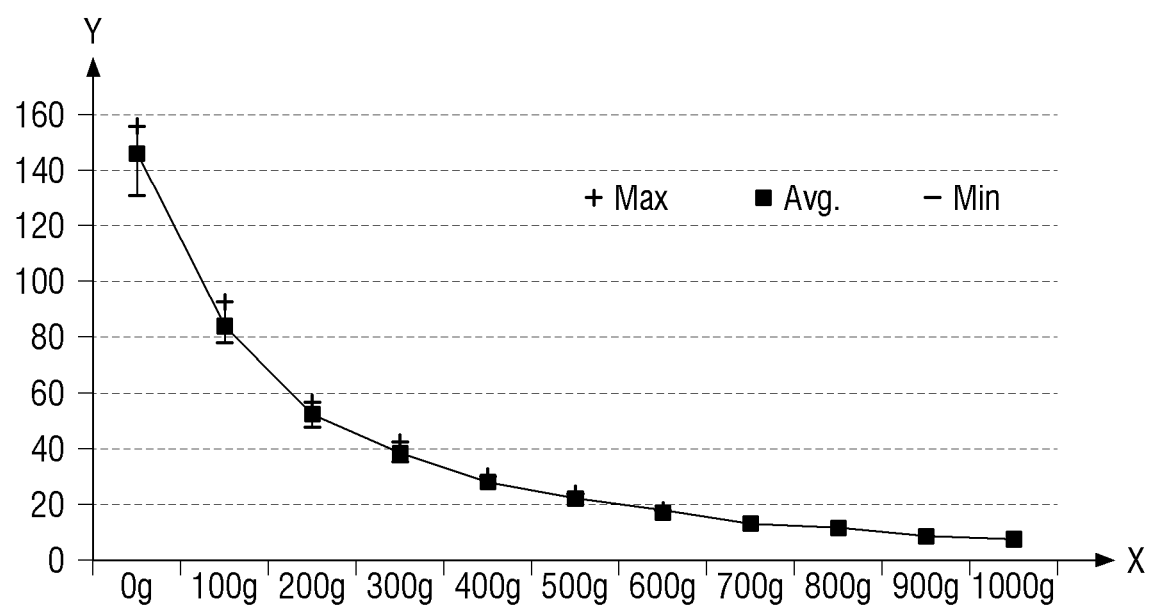
FIG. 4 is a graph showing the resistance value of a force sensing layer according to the weight applied to the force sensor of FIG. 2.

For example, FIG. 4 shows a change in the resistance value of the force sensing layer when 0 g to 1000 g of an object is placed on the second substrate SUB2 of the force sensor 10. In FIG. 4, the X-axis indicates the weight of the object placed on the second substrate SUB2, and the Y-axis indicates the resistance value of the force sensing layer. The force sensing unit FD applies a driving voltage to the driving line TL of the force sensor 10 and then senses a current or voltage of a sensing line of the force sensor 10, thereby calculating the resistance value of the force sensing layer connected to the sensing line of the force sensor 10.

When no object is placed on the second substrate SUB2 of the force sensor 10 (0 g), as shown in FIG. 3A, gaps exist between the first force sensing layer PSL1 and the first driving electrodes TE1 and between the first force sensing layer PSL1 and the first sensing electrodes RE1. Therefore, no voltage is applied to the first sensing electrodes RE1, or no current flows toward the first sensing electrodes RE1. Thus, the resistance value of the force sensing layer may be very high, approximately 145kΩ.

As the weight of the object placed on the second substrate SUB2 of the force sensor 10 increases, an area in which the first force sensing layer PSL1 contacts the first driving electrodes TE1 and the first sensing electrodes RE1 increases. Thus, as the weight of the object placed on the second substrate SUB2 of the force sensor 10 increases, the amount of current flowing from the first driving electrodes TE1 to the first sensing electrodes RE1 through the first force sensing layer PSL1 increases. Therefore, as the weight of the object placed on the second substrate SUB2 of the force sensor 10 increases, as shown in FIG. 4, the resistance value of the force sensing layer decreases.

Further, as the weight of the object placed on the second substrate SUB2 of the force sensor 10 increases, the degree of scattering of the resistance value of the force sensing layer decreases. For example, when no object is placed on the second substrate SUB2 of the force sensor 10 (0 g), the degree of scattering of the resistance value of the force sensing layer is 130kΩ to 155kΩ, approximately 25kΩ. Further, when 100 g of an object is placed on the second substrate SUB2 of the force sensor 10, the degree of scattering of the resistance value of the force sensing layer is 75kΩ to 90 kΩ, approximately 15kΩ. Further, when 200 g of an object is placed on the second substrate SUB2 of the force sensor 10, the degree of scattering of the resistance value of the force sensing layer is 45kΩ to 55kΩ, approximately 10kΩ. Further, when 300 g of an object is placed on the second substrate SUB2 of the force sensor 10, the degree of scattering of the resistance value of the force sensing layer is 35kΩ to 42kΩ, approximately 7 Further, when 400 g of an object is placed on the second substrate SUB2 of the force sensor 10, the degree of scattering of the resistance value of the force sensing layer is 5kΩ or less.

As described above, according to the embodiment shown in FIG. 2, in the force sensor 10, the area of contact of the first force sensing layer PSL1 with the first driving electrode TE1 and the first sensing electrode RE1 varies depending on the applied force, so that the resistance value of the force sensing layer may be changed. Therefore, the force sensor 10 may sense the force applied by a hand of a user.

However, as shown in FIG. 4, the difference in resistance value of the force sensing layer is large between when no object is placed on the second substrate SUB2 of the force sensor 10 (0 g) and when the weight of the object placed on the second substrate SUB2 is 1000 g, so that the range of the resistance value of the force sensing layer, sensed by the force sensing unit FD, is wide, and thus the manufacturing cost of the force sensing unit FD may increase. Therefore, it is necessary to reduce the range of the resistance value of the force sensing layer according to the force applied to the force sensor 10.

Further, when 300 g or less of an object is placed on the second substrate SUB2 of the force sensor 10, the degree of scattering of the resistance value of the force sensing layer is large, approximately 7kΩ or more. When the degree of scattering of the resistance value of the force sensing layer is large, a force may be erroneously sensed, so that it is also necessary to reduce the degree of scattering of the resistance value of the force sensing layer according to the pressure applied to the force sensor 10.

Hereinafter, embodiments in which the resistance value range of the force sensing layer and the degree of scattering of the resistance value of the force sensing layer according to the pressure applied to the force sensor 10 can be reduced will be described.

Figure 5:
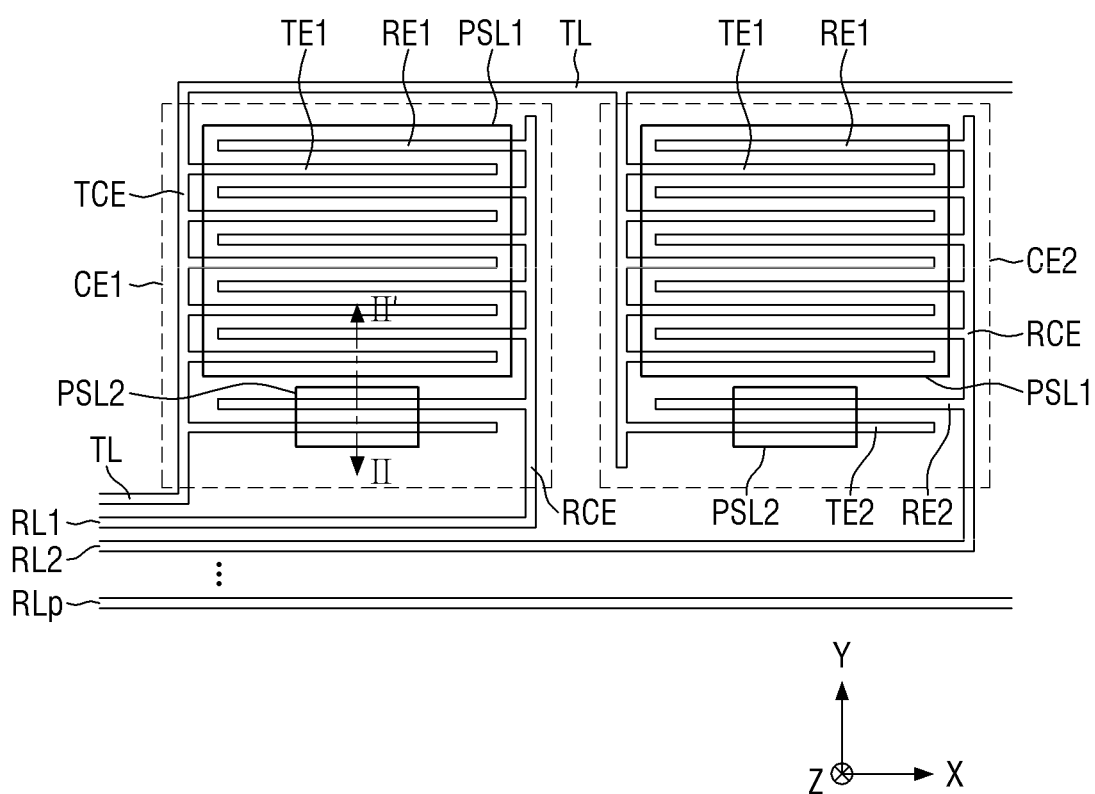
FIG. 5 is a plan view showing another example of the area A of FIG. 1.
Figure 6:
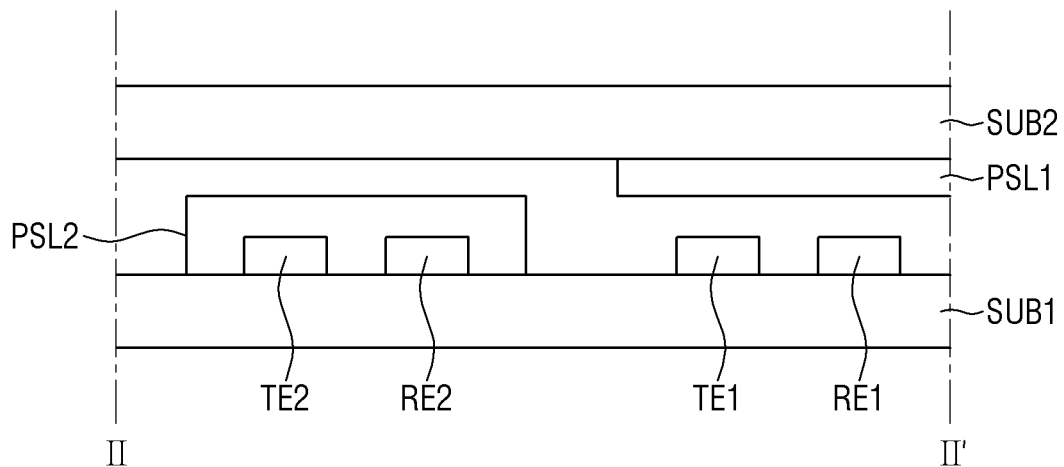
FIG. 6 is an example of a cross-sectional view taken along the line II-II' of FIG. 5.
Figure 6:
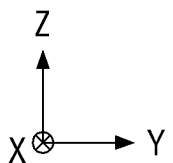

FIG. 5 is a plan view showing another example of the area A of FIG. 1. FIG. 6 is an example of a cross-sectional view taken along the line II-II' of FIG. 5.

Figure 2:
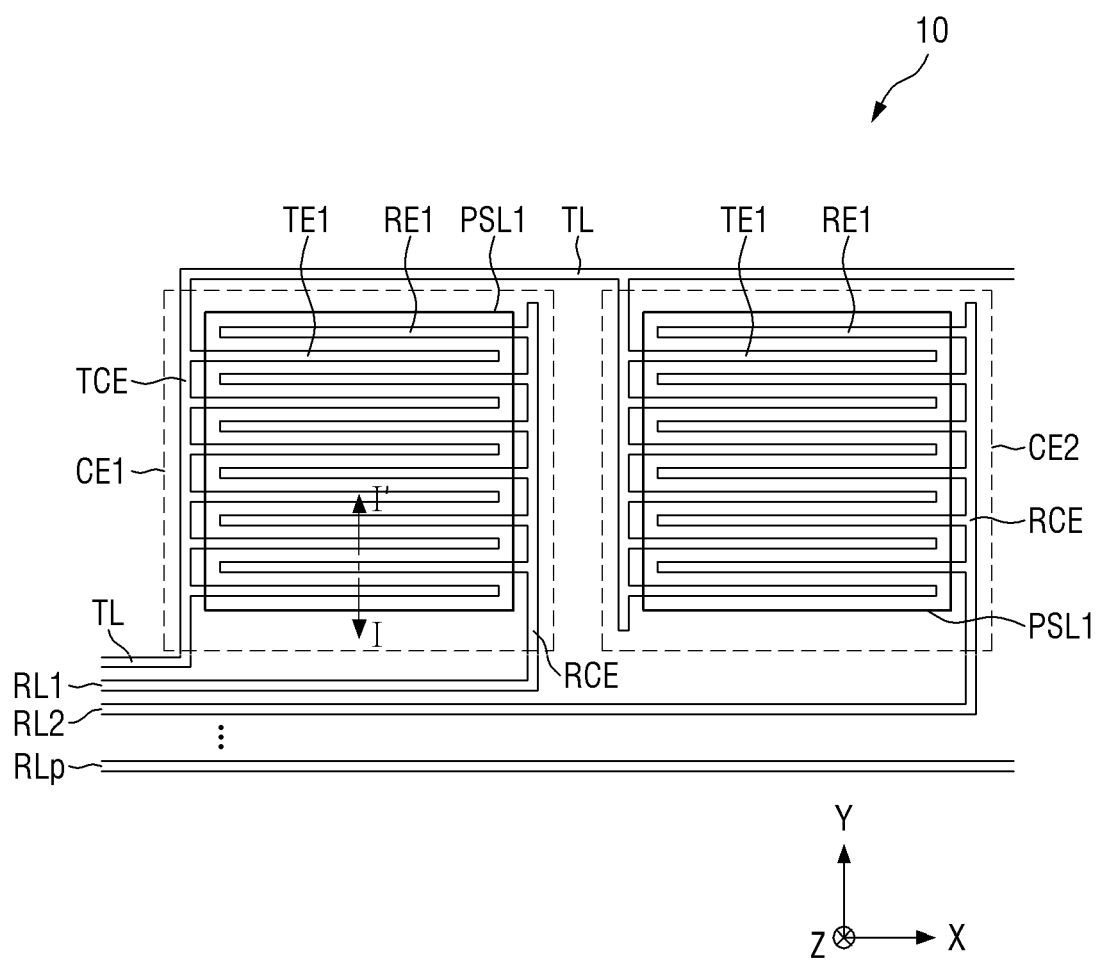
FIG. 2 is a plan view showing an example of the area A of FIG. 1.

The features shown in FIGS. 5 and 6 are different from the features shown in FIGS. 2, 3A, and 3B in that each of the force sensing layers CE1 to CEp further includes a second driving electrode TE2, a second sensing electrode RE2, and a second force sensing layer RPL2. Therefore, in FIGS. 5 and 6, some repetitive description of the features shown in FIGS. 2, 3A and 3B may be omitted for brevity.

Referring to FIGS. 5 and 6, the second driving electrode TE2 and the second sensing electrode RE2 are located on one surface of the first substrate SUB1 facing the second substrate SUB2. Although FIGS. 5 and 6 show one second driving electrode TE2 and one second sensing electrode RE2, the embodiments shown in FIGS. 5 and 6 are not limited thereto. That is, the plurality of second driving electrodes TE2 and the plurality of second sensing electrodes RE2 may be located on one surface of the first substrate SUB1 facing the second substrate SUB2.

The second driving electrode TE2 may be branched in the width direction (X-axis direction) of the driving connection electrode TCE. The second driving electrode TE2 may be arranged in parallel with the first driving electrode TE1.

The second sensing electrode RE2 may be branched in the width direction (X-axis direction) of the sensing connection electrode RCE. The second sensing electrode RE2 may be arranged in parallel with the first sensing electrode RE1.

The second driving electrode TE2 and the second sensing electrode RE2 may be located on the same layer as the first driving electrode TE1 and the first sensing electrode RE1. The second driving electrode TE2 and the second sensing electrode RE2 may be made of the same material as the first driving electrode TE1 and the first sensing electrode RE1. For example, the second driving electrode TE2 and the second sensing electrode RE2 may include a conductive material such as silver (Ag) or copper (Cu). The second driving electrode TE2 and the second sensing electrode RE2 may be formed on the first substrate SUB1 by a screen printing method.

The second driving electrode TE2 and the second sensing electrode RE2 are located adjacent to each other, but are not connected to each other. The second driving electrode TE2 and the second sensing electrode RE2 may be arranged in parallel with each other.

The second driving electrode TE2 and the second sensing electrode RE2 may not overlap the first force sensing layer PSL1. The second sensing electrode RE2 may be located between the second driving electrode TE2 and the first driving electrode TE1. In this case, the distance between the second driving electrode TE2 and the second sensing electrode RE2 may be shorter than the distance between the first driving electrode TE1 and the second sensing electrode RE2.

The second force sensing layer PSL2 may be in contact with the second driving electrode TE2 and the second sensing electrode RE2. That is, the second driving electrode TE2 and the second sensing electrode RE2 may be connected through the second force sensing layer PSL2.

The second force sensing layer PSL2 may be arranged to cover the second driving electrode TE2 and the second sensing electrode RE2 as shown in FIG. 6. The second force sensing layer PSL2 may be arranged to cover the upper surface and side surfaces of the second driving electrode TE2 and the second sensing electrode RE2. The second force sensing layer PSL2 may not overlap the first force sensing layer PSL1.

The second force sensing layer PSL2 may be formed of the same material as the first force sensing layer PSL1. In this case, the second force sensing layer PSL2 may include a pressure-sensitive material and a polymer resin in which the pressure-sensitive material is provided. The pressure sensitive material may include fine metal particles of nickel, aluminum, titanium, tin, or copper. For example, the second force sensing layer PSL2 may be a quantum tunneling composite (QTC).

Figure 7:
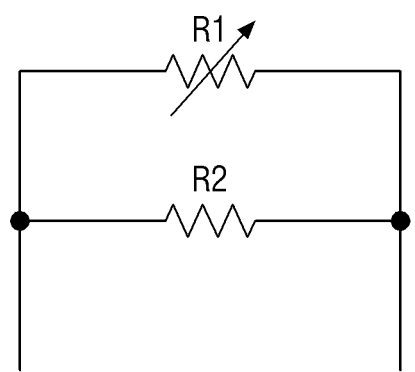
FIG. 7 is a circuit diagram of the force sensor of FIG. 5.

The first force sensing layer CE1 is represented as including a first resistor R1 and a second resistor R2 connected in parallel between the driving line TL and the first sensing line RL1 as shown in FIG. 7. The first resistor R1 indicates a resistance generated by the first force sensing layer PSL1 located between the first driving electrodes TE1 and the first sensing electrodes RE1, and the second resistor R2 indicates a resistance generated by the second force sensing layer PSL2 located between the second driving electrode TE2 and the second sensing electrode RE2. Because the contact area of the first force sensing layer PSL1 contacting the first driving electrodes TE1 and the first sensing electrodes RE1 varies depending on the force, the first resistance R1 corresponds to a variable resistance. In this case, the resistance R of the first force sensing layer CE1 may be calculated by Equation 1 below.

$$\frac{1}{R} = \frac{1}{R1} + \frac{1}{R2} \qquad \text{[Equation 1]}$$

Equation 1 may be summarized as Equation 2 below.

$$R = \frac{R1 \times R2}{R1 + R2} \qquad \text{[Equation 2]}$$

Further, the resistance change ΔR of the first force sensing layer CE1 due to the change of the first resistor R1 may be calculated by Equation 3.

$$\Delta R = R2 - R = \frac{R2^2}{R1 + R2} \qquad \text{[Equation 3]}$$

Because the circuit diagram of each of the second to p-th force sensing layers CE2 to CEp may be the same as (or substantially the same as) the circuit diagram of the first force sensing layer CE1 shown in FIG. 7, the resistance R and the resistance change ΔR of each of the second to p-th force sensing layers CE2 to CEp may also be calculated to be the same as (or substantially the same as) Equations 1 to 3.

As shown in FIGS. 5 and 6, each of the first to p-th force sensing layers CE1 to CEp includes a first resistor R1 whose resistance varies according to the force applied by the first force sensing layer PSL1, and a second resistor R2 defined by the second force sensing layer PSL2 contacting the second driving electrode TE2 and the second sensing electrode RE2. That is, because each of the first to p-th force sensing layers CE1 to CEp includes the second resistor R2 irrespective of the applied force, the resistance R of each of the first to p-th force sensing layers CE1 to CEp may be lowered.

Meanwhile, the second driving electrode TE2 and the second sensing electrode RE2 are connected to the second force sensing layer PSL2 to form the second resistor R2. The number of the second driving electrodes TE2 and the second sensing electrodes RE2 need not be large. In contrast, because the first driving electrode TE1 and the first sensing electrode RE1 sense the force according to the area in contact with the first force sensing layer PSL1, the first driving electrode TE1 and the first sensing electrode RE1 may be formed in plural. The number of the second driving electrodes TE2 may be smaller than the number of the first driving electrodes TE1, and the number of the second sensing electrodes RE2 may be smaller than the number of the first sensing electrodes RE1.

Further, as the thickness of the second driving electrode TE2 and the thickness of the second sensing electrode RE2 increase, the second resistance R2 may decrease. Further, as the width of the second driving electrode TE2 and the width of the second sensing electrode RE2 increase, the second resistance R2 may decrease. Further, as the number of the second driving electrode TE2 and the number of the second sensing electrodes RE2, being in contact with the second force sensing layer PSL2, increase, the contact area between the second force sensing layer PSL2 and the second driving electrode TE2 and the contact area between the second force sensing layer PSL2 and the second sensing electrode RE2 increase, and thus the second resistance R2 may decrease. Further, as the area of the second force sensing layer PSL2 contacting the second driving electrode TE2 and the second sensing electrode RE2 increases, the second resistance R2 may decrease. Therefore, the size of the second resistor R2 may be designed in consideration of the thickness of the second driving electrode TE, the thickness of the second sensing electrode RE2, the width of the second driving electrode TE, the width of the second sensing electrode RE2, the number of the second driving electrodes TE2, the number of the second sensing electrodes RE2, and the area of the second force sensing layer PSL2 contacting the second driving electrode TE2 and the second sensing electrode RE2.

Figure 8:
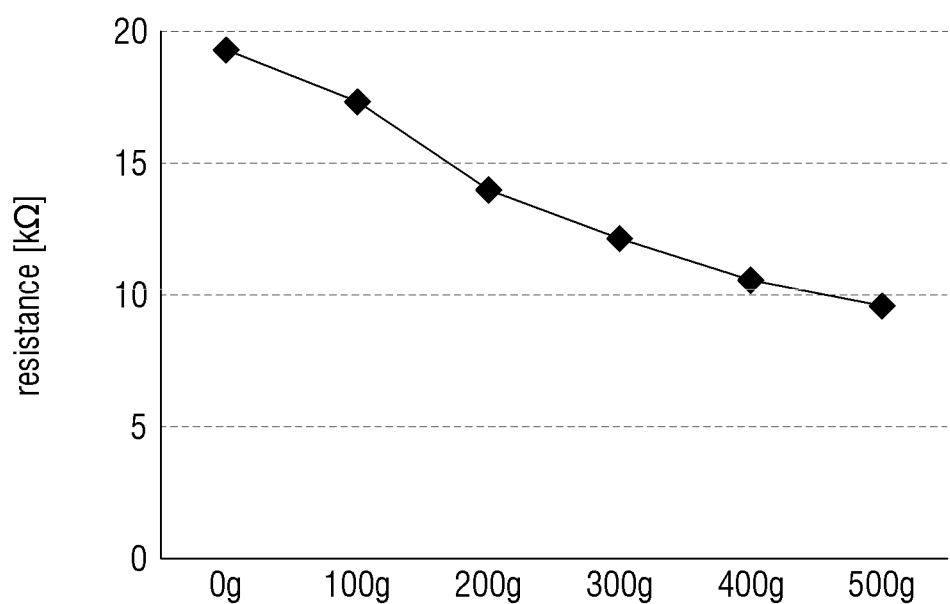
FIG. 8 is a graph showing the resistance value of a force sensing layer according to the weight applied to the force sensor of FIG. 5.

FIG. 8 shows a change in the resistance value of the force sensing layer when 0 g to 500 g of an object is placed on the second substrate SUB2 of the force sensor 10. In FIG. 8, the X-axis indicates the weight of the object placed on the second substrate SUB2, and the Y-axis indicates the resistance value of the force sensing layer. The force sensing unit FD applies a driving voltage to the driving line TL of the force sensor 10 and then senses a current or voltage of the sensing line of the force sensor 10, thereby calculating the resistance value of the force sensing layer connected to the sensing line of the force sensor 10.

When no object is placed on the second substrate SUB2 of the force sensor 10 (0 g), the resistance value of the force sensing layer is approximately 19kΩ. As the weight of the object placed on the second substrate SUB2 of the force sensor 10 increases, an area in which the first force sensing layer PSL1 contacts the first driving electrodes TE1 and the first sensing electrodes RE1 increases, and thus the amount of current flowing from the first driving electrodes TE1 to the first sensing electrodes RE1 through the first force sensing layer PSL1 increases.

Therefore, as the weight of the object placed on the second substrate SUB2 of the force sensor 10 increases, the resistance value of the force sensing layer decreases. For example, as shown in FIG. 8, when the weight of the object placed on the second substrate SUB2 of the force sensor 10 is 100 g, the resistance value of the force sensing layer is approximately 17kΩ, when the weight thereof is 200 g, the resistance value thereof is approximately 14kΩ, when the weight thereof is 300 g, the resistance value thereof is approximately 12kΩ, when the weight thereof is 400 g, the resistance value thereof is approximately 11kΩ, and when the weight thereof is 500 g, the resistance value thereof is approximately 9kΩ.

As described above, according to the embodiment shown in FIGS. 5 and 6, as shown in FIG. 8, the difference in resistance value of the force sensing layer is only approximately 10kΩ between when no object is placed on the second substrate SUB2 of the force sensor 10 (0 g) and when the weight of the object placed on the second substrate SUB2 is 500 g. In contrast, according to the embodiment shown in FIGS. 2, 3A and 3B, as shown in FIG. 4, the difference in resistance value of the force sensing layer is approximately 130kΩ between when no object is placed on the second substrate SUB2 of the force sensor 10 (0 g) and when the weight of the object placed on the second substrate SUB2 is 500 g. Therefore, the embodiment shown in FIGS. 5 and 6 may have a characteristic in which the range of the resistance value of the force sensing layer, sensed by the force sensing unit FD, can be greatly reduced. Further, thus, in the embodiment shown in FIGS. 5 and 6, the manufacturing cost of the force sensing unit FD can be reduced.

Meanwhile, the side inclination angle of the second driving electrode TE2 and the side inclination angle of the second sensing electrode RE2 may be different depending on an error in the manufacturing process. Thus, an area in which the second force sensing layer PRL2 covering the second driving electrode TE2 and the second sensing electrode RE2 contacts the side surface of the second driving electrode TE2 and an area in which the second force sensing layer PRL2 contacts the side surface of the second sensing electrode RE2 may be different for each force sensing layer.

Figure 9A:
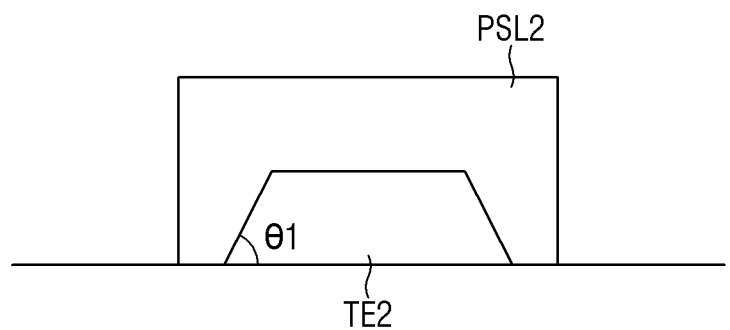
FIGS. 9A and 9B are cross-sectional views of second force sensing layers covering second driving electrodes having first and second side inclination angles, respectively.
Figure 9B:
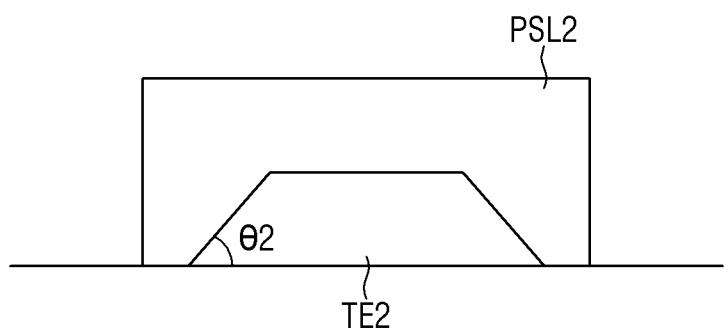

For example, when the side inclination angle of the second driving electrode TE2 is set to a first angle θ1 as shown in FIG. 9A, and when the side inclination angle of the second driving electrode TE2 is set to a second angle θ2 as shown in FIG. 9B, a side inclination is steep. Thus, when the side inclination angle of the second driving electrode TE2 is set to a first angle θ1 as shown in FIG. 9A, the area in which the second force sensing layer PRL2 contacts the side surface of the second driving electrode TE2 is small compared to when the side inclination angle of the second driving electrode TE2 is set to a second angle θ2 as shown in FIG. 9B. That is, the contact area between the second force sensing layer PRL2 and the side surface of the second driving electrode TE2 is changed according to the side inclination angle of the second driving electrode TE2, so that the size of the second resistor R2 is changed. Similarly, the contact area between the second force sensing layer PRL2 and the side surface of the second sensing electrode RE2 is changed according to the side inclination angle of the second sensing electrode RE2, so that the size of the second resistor R2 is changed.

As a result, the size of the second resistor R2 depends on the side inclination angle of the second driving electrode TE2 and the side inclination angle of the second sensing electrode RE2. Therefore, when the side inclination angle of the second driving electrode TE2 and the second sensing electrode RE2 in the force sensing layers are made uniform, or when the contact area between the second force sensing layer PRL2 and the second driving electrode TE2 in the force sensing layers and the contact area between the second force sensing layer PRL2 and the second sensing electrode RE2 in the force sensing layers are made uniform, the degree of resistance scattering of the force sensing layer, having been described with reference to FIG. 4, may be reduced.

Figure 10:
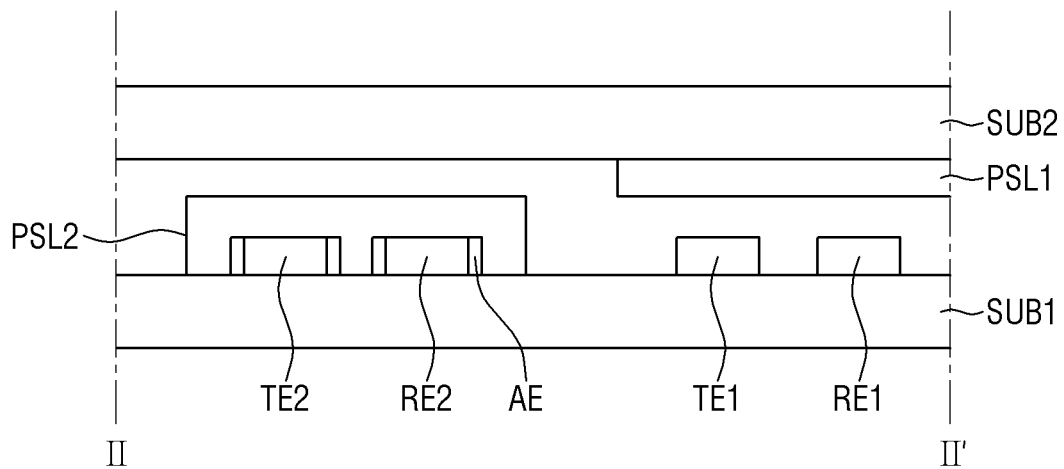
FIG. 10 is another example of a cross-sectional view taken along the line II-II' of FIG. 5.
Figure 10:
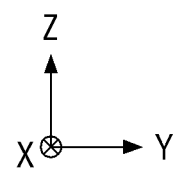
Figure 11:
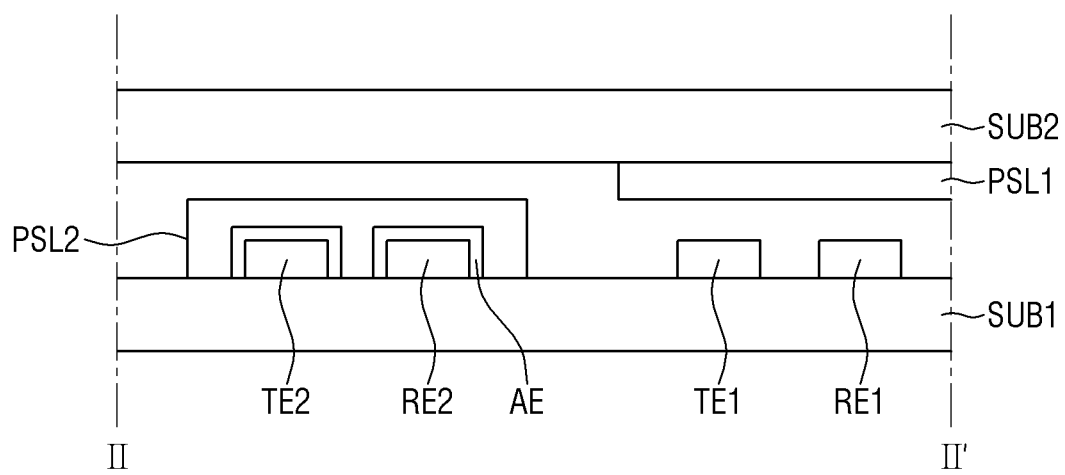
FIG. 11 is still another example of a cross-sectional view taken along the line II-II' of FIG. 5.

FIG. 10 is another example of a cross-sectional view taken along the line II-II' of FIG. 5.

The embodiment shown in FIG. 10 is different from the embodiment shown in FIG. 6 in that auxiliary electrodes AE are formed on the side surfaces of the second driving electrode TE2 and the side surfaces of the second sensing electrodes RE2. In FIG. 10, a description overlapping the embodiment shown in FIG. 6 will be omitted.

Referring to FIG. 10, auxiliary electrodes AE are formed on the side surfaces of the second driving electrode TE2 and the side surfaces of the second sensing electrodes RE2. Each of the auxiliary electrodes AE may be a fine wire or a nanowire including a metal such silver (Ag), nickel (Ni), platinum (Pt), or gold (Au), or a semiconductor such as InP, GaN, or ZnO. The metal included in each of the auxiliary electrodes AE may be substantially the same as the metal included in the second driving electrode TE2 and the second sensing electrode RE2. For example, when the second driving electrode TE2 and the second sensing electrode RE2 are formed of silver (Ag), each of the auxiliary electrodes AE may be formed of a silver fine wire or a silver nanowire.

As shown in FIG. 10, auxiliary electrodes AE such as fine wires or nanowires are located on the side surfaces of the second driving electrode TE2 and the side surfaces of the second sensing electrodes RE2, and the second force sensing layer PSL2 is located on the auxiliary electrodes AE, thereby increasing the uniformity of the side inclination angle of the second driving electrode TE2 and the side inclination angle of the second sensing electrode RE2. Therefore, the degree of resistance scattering of the force sensing layer can be reduced.

Meanwhile, the auxiliary electrodes AE may also be formed on the upper surface of the second driving electrode TE2 and the upper surface of the second sensing electrode RE2 as well as the side surfaces of the second driving electrode TE2 and the side surfaces of the second sensing electrodes RE2.

Figure 12:
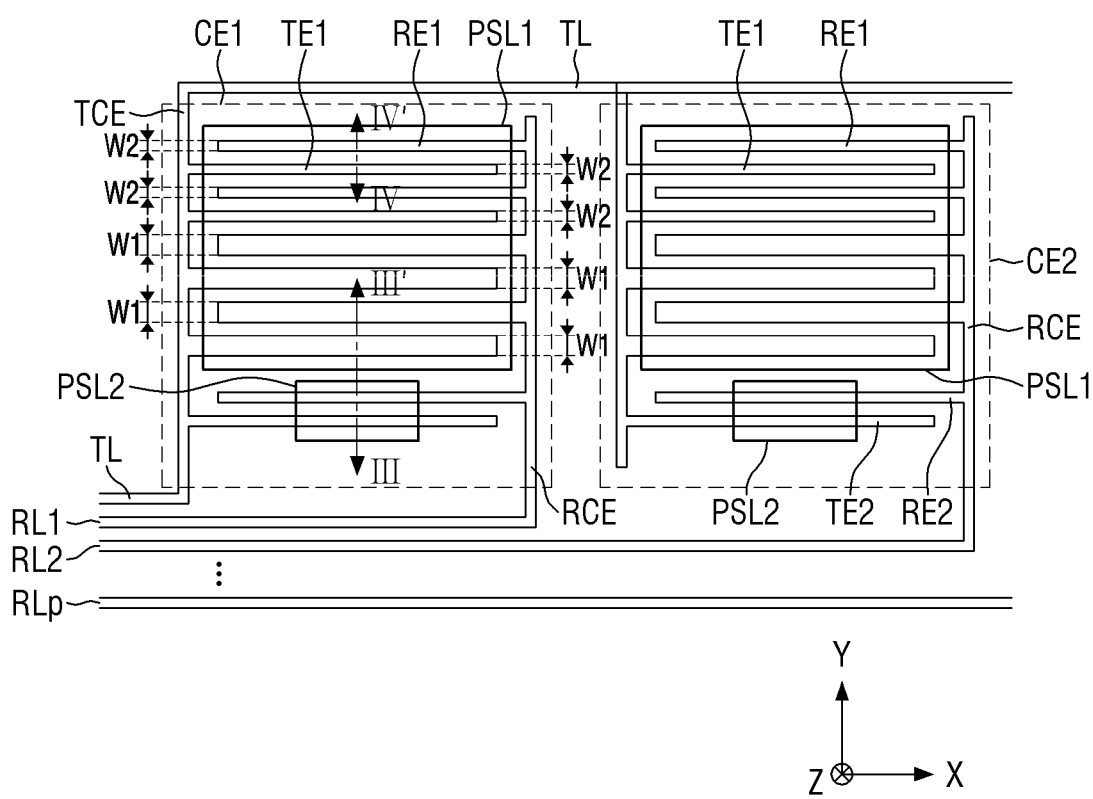
FIG. 12 is a plan view showing still another example of the area A of FIG. 1.
Figure 13:
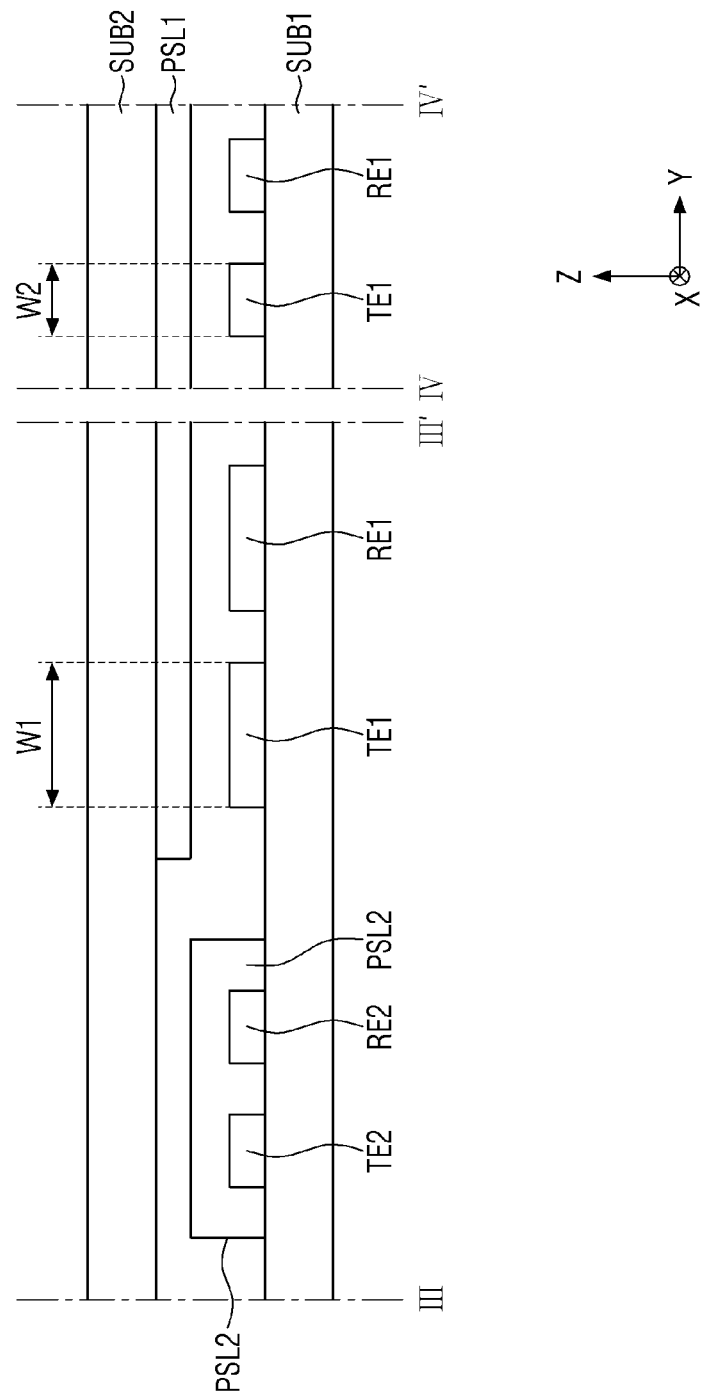
FIG. 13 is an example of a cross-sectional view taken along the line III-III' and IV-IV' of FIG. 12.

FIG. 12 is a plan view showing still another example of the area A of FIG. 1. FIG. 13 is an example of a cross-sectional view taken along the line and IV-IV' of FIG. 12.

The features shown in FIGS. 12 and 13 are different from the features shown in FIGS. 5 and 6 in that the widths of the first driving electrodes TE1 are different from each other in the length direction (Y-axis direction) of the driving connection electrode TCE and the widths of the first sensing electrodes RE1 are different from each other in the length direction (Y-axis direction) of the sensing connection electrode RCE. In FIGS. 12 and 13, some repetitive description with respect to the features shown in FIGS. 5 and 6 may be omitted.

Referring to FIGS. 12 and 13, the widths of the first driving electrodes TE1 are different from each other in the length direction (Y-axis direction) of the driving connection electrode TCE. For example, the first driving electrode TE1 adjacent to the second sensing electrode RE2 may have a first width w1, and the first driving electrode TE1 farthest from the second sensing electrode RE2 may have a second width w2 smaller than the first width w1. The first driving electrode TE1 farthest from the second sensing electrode RE2 may be a first driving electrode TE1 closest to the driving line TL. For example, as shown in FIG. 12, each of the plurality of first driving electrodes TE1 adjacent to the second sensing electrode RE2 may have a first width w1, and each of the plurality of first driving electrodes TE1 adjacent to the driving line TL may have a second width w2 smaller than the first width w1. Or, the widths of the first driving electrodes TE1 may become narrower from the first driving electrode TE1 adjacent to the second sensing electrode RE2 to the first driving electrode TE1 closest to the driving line TL.

The widths of the first sensing electrodes RE1 are different from each other in the length direction (Y-axis direction) of the sensing connection electrode RCE. Specifically, the first sensing electrode RE1 adjacent to the second sensing electrode RE2 may have a first width w1, and the first sensing electrode RE1 farthest from the second sensing electrode RE2 may have a second width w2 smaller than the first width w1. The first sensing electrode RE1 farthest from the second sensing electrode RE2 may be a first sensing electrode RE1 closest to the driving line TL. For example, as shown in FIG. 12, each of the plurality of first sensing electrodes RE1 adjacent to the second sensing electrode RE2 may have a first width w1, and each of the plurality of first sensing electrodes RE1 adjacent to the driving line TL may have a second width w2 smaller than the first width w1. Or, the widths of the first sensing electrodes RE1 may become narrower from the first sensing electrode RE1 adjacent to the second sensing electrode RE2 to the first sensing electrode RE1 closest to the driving line TL.

When the same force is applied to the first force sensing layer PSL1, the contact area of the first force sensing layer PSL1 contacting the first driving electrode TE1 having the first width w1 and the first sensing electrode RE1 having the first width w1 is larger than the contact area of the first force sensing layer PSL1 contacting the first driving electrode TE1 having the second width w2 and the first sensing electrode RE1 having the second width w2. Therefore, when the same force is applied to the first force sensing layer PSL1, when each of the width of the first driving electrode TE1 and the width of the first sensing electrode RE1 is the first width w1, the size of the first resistor R1 becomes small compared to when each of the width of the first driving electrode TE1 and the width of the first sensing electrode RE1 is the second width w2. Thus, when a user applies a force to a region where each of the width of the first driving electrode TE1 and the width of the first sensing electrode RE1 is the first width w1 and when the user applies a force to a region where each of the width of the first driving electrode TE1 and the width of the first sensing electrode RE1 is the second width w2, the sensed resistance values may be different from each other. Therefore, the user may determine whether the user applies a force to the region where the first driving electrodes TE1 having the first width w1 and the first sensing electrodes RE1 having the first width w1 or whether the user applies a force to the region where the first driving electrodes TE1 having the second width w2 and the first sensing electrodes RE1 having the second width w2. That is, the force applied to a plurality of positions in one force sensing layer may be distinguished and sensed.

Further, although it is illustrated in FIGS. 12 and 13 that the widths of the first driving electrodes TE1 and the widths of the first sensing electrodes RE1 are different from each other in the length direction (Y-axis direction) of the driving connection electrode TCE or the sensing connection electrode RCE, the present invention is not limited thereto, and the thicknesses of the first driving electrodes TE1 and the thicknesses of the first sensing electrodes RE1 may be different from each other in the length direction (Y-axis direction) of the driving connection electrode TCE or the sensing connection electrode RCE.

Figure 14:
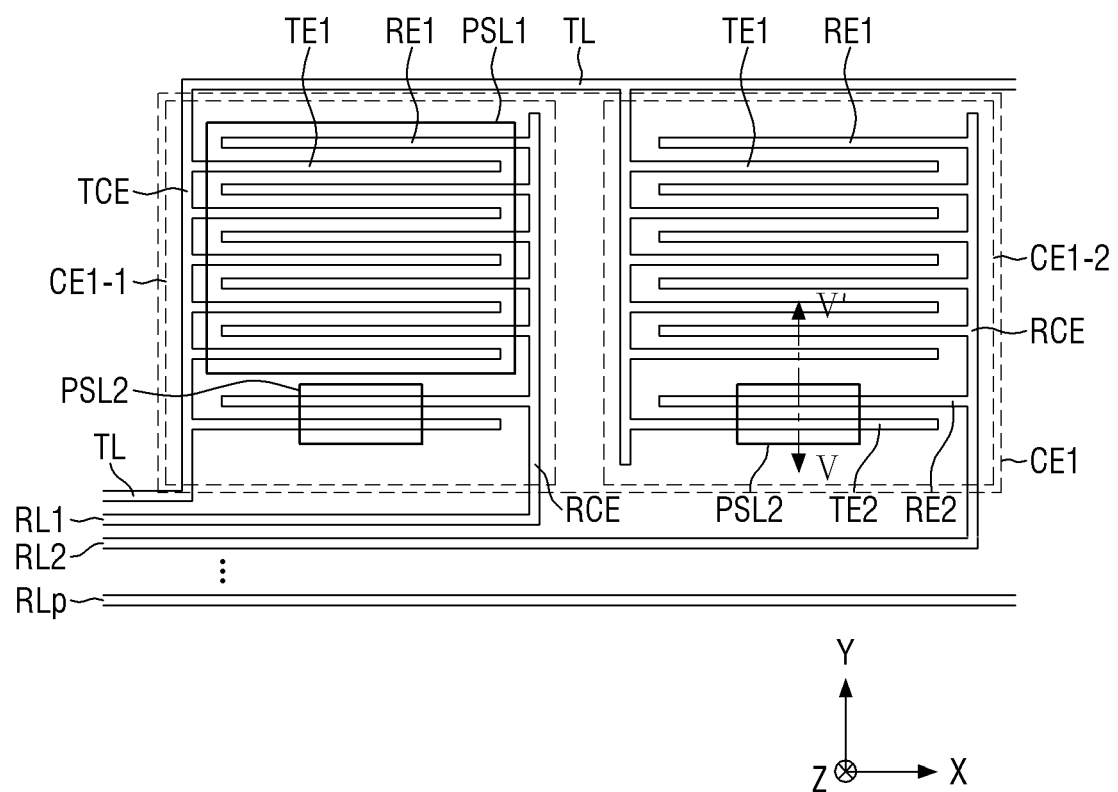
FIG. 14 is a plan view showing still another example of the area A of FIG. 1.
Figure 15:
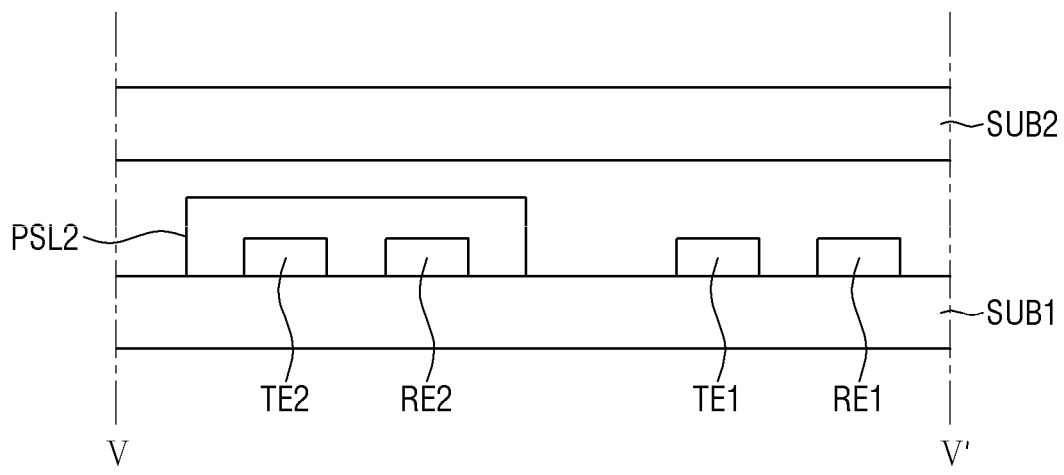
FIG. 15 is an example of a cross-sectional view taken along the line V-V' of FIG. 14.

FIG. 14 is a plan view showing still another example of the area A of FIG. 1. FIG. 15 is an example of a cross-sectional view taken along the line V-V' of FIG. 14.

The features shown in FIGS. 14 and 15 are different from the features shown in FIGS. 5 and 6 in that the first force sensing layer CE1 includes a 1-1 sensing cell CE1-1 and a 1-2 sensing cell CE1-2. In FIGS. 14 and 15, some repetitive description with respect to the features shown in FIGS. 5 and 6 may be omitted.

The first driving electrode TE1, the second driving electrode TE2, the driving connection electrode TCE, the first sensing electrode RE1, the second sensing electrode RE2, the sensing connection electrode RCE, the first force sensing layer PSL1, and the second force sensing layer PSL2 of the 1-1 sensing cell CE1-1 are substantially the same as those described with reference to FIGS. 5 and 6. Further, the 1-2 sensing cell CE1-2 is substantially the same as that described with reference to FIGS. 5 and 6, except that the first force sensing layer PSL1 is omitted.

Because the 1-2 sensing cell CE1-2 does not include the first force sensing layer PSL1, the 1-2 sensing cell CE1-2 may not sense a change in the resistance value of the 1-2 sensing cell CE1-2 depending on applied force. Instead, the 1-2 sense cell CE1-2 may sense a change in the resistance value of the first sensing electrode RE1 depending on the temperature. That is, the force applied to the first force sensing layer CE1 may be sensed using the first sensing cell CE1-1, and the change in the resistance value depending on the temperature may be sensed using the first sensing cell CE1-2. Thus, the force sensing unit FD compensates the resistance value sensed by the 1-1 sensing cell CE1-1 using the resistance value sensed by the 1-2 sensing cell CE1-2, thereby compensating the occurrence of a change in the resistance value sensed by the first force sensing layer CE1 depending on temperature.

Each of the second to p-th force sensing layers CE2 to CEp may also be configured substantially the same as the first force sensing layer CE1 shown in FIGS. 14 and 15.

Figure 16:
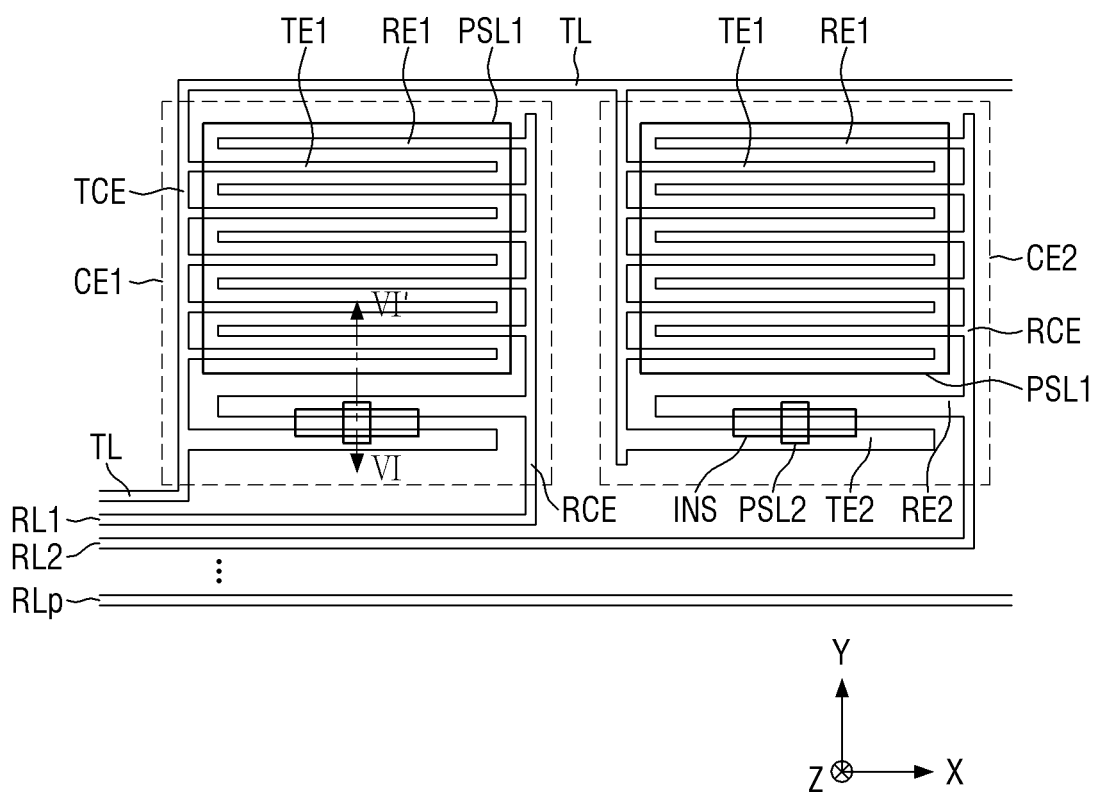
FIG. 16 is a plan view showing still another example of the area A of FIG. 1.
Figure 17:
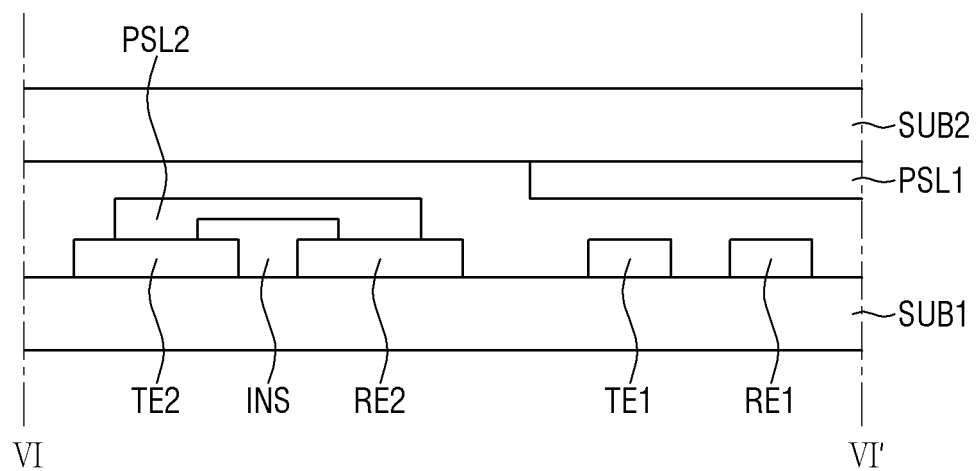
FIG. 17 is an example of a cross-sectional view taken along the line V I-VI' of FIG. 16.

FIG. 16 is a plan view showing still another example of the area A of FIG. 1. FIG. 17 is an example of a cross-sectional view taken along the line VI-VI' of FIG. 16.

The features shown in FIGS. 16 and 17 are different from the features shown in FIGS. 5 and 6 in that an insulating film INS covering a part of the second driving electrode TE2 and a part of the second sensing electrode RE2 is formed, and the second force sensing layer PSL2 covers a part of the insulating film INS and is formed on a part of the upper surface of the second driving electrode TE2 and a part of the upper surface of the second sensing electrode RE2. In FIGS. 16 and 17, some repetitive description with respect to the features shown in FIGS. 5 and 6 may be omitted.

Referring to FIGS. 16 and 17, the insulating film INS is formed to cover a part of the second driving electrode TE2 and a part of the second sensing electrode RE2. For example, the insulating film INS is formed to cover a part of the upper surface of the second driving electrode TE2 and a part of the upper surface of the second sensing electrode RE2. Further, the insulating film INS is formed to cover a part of the side surface of the second driving electrode TE2 facing the second sensing electrode RE2 and a part of the side surface of the second sensing electrode RE2 facing the second driving electrode TE2. The insulating film INS may be located in a space between the side surface of the second driving electrode TE2 facing the second sensing electrode RE2 and the side surface of the second sensing electrode RE2 facing the second driving electrode TE2. The insulating film INS may be formed of an inorganic material or an organic material, which is an electrically insulating material.

The second force sensing layer PSL2 covers a part of the insulating film INS, and is formed to cover another part of the upper surface of the second driving electrode TE2 and another part of the upper surface of the second sensing electrode RE2. For example, the second force sensing layer PSL2 may be formed to cover a part of the upper surface of the insulating film INS and some of the side surfaces of the insulating film INS. The second force sensing layer PSL2 contacts another part of the upper surface of the second driving electrode TE2 and another part of the upper surface of the second sensing electrode RE2. For this purpose, as shown in FIG. 16, the insulating film INS may be located long in the width direction (X-axis direction) of the driving connection electrode TCE, whereas the second force sensing layer PSL2 may be located long in the length direction (Y-axis direction) of the driving connection electrode TCE. That is, the width of the insulating film INS in the length direction (Y-axis direction) of the driving connection electrode TCE may be smaller than the width of the second force sensing layer PSL2.

Further, because the second force sensing layer PSL2 contacts only a part of the upper surface of the second driving electrode TE2 and a part of the upper surface of the second sensing electrode RE2, in order to increase the contact area of the second force sensing layer PSL2 contacting the second driving electrode TE2 and the second sensing electrode RE2, the width of the second driving electrode TE2 and the width of the second sensing electrode RE2 may be formed wider than those of the embodiment shown in FIGS. 5 and 6.

According to the embodiment shown in FIGS. 16 and 17, because the second force sensing layer PSL2 is not formed on the side surfaces of the second driving electrode TE2 and the side surfaces of the second sensing electrode RE2, it is possible to prevent the resistance scattering of the force sensing layer from occurring due to the side inclination angle of the second driving electrode TE2 and the side inclination angle of the second sensing electrode RE2.

Figure 18:
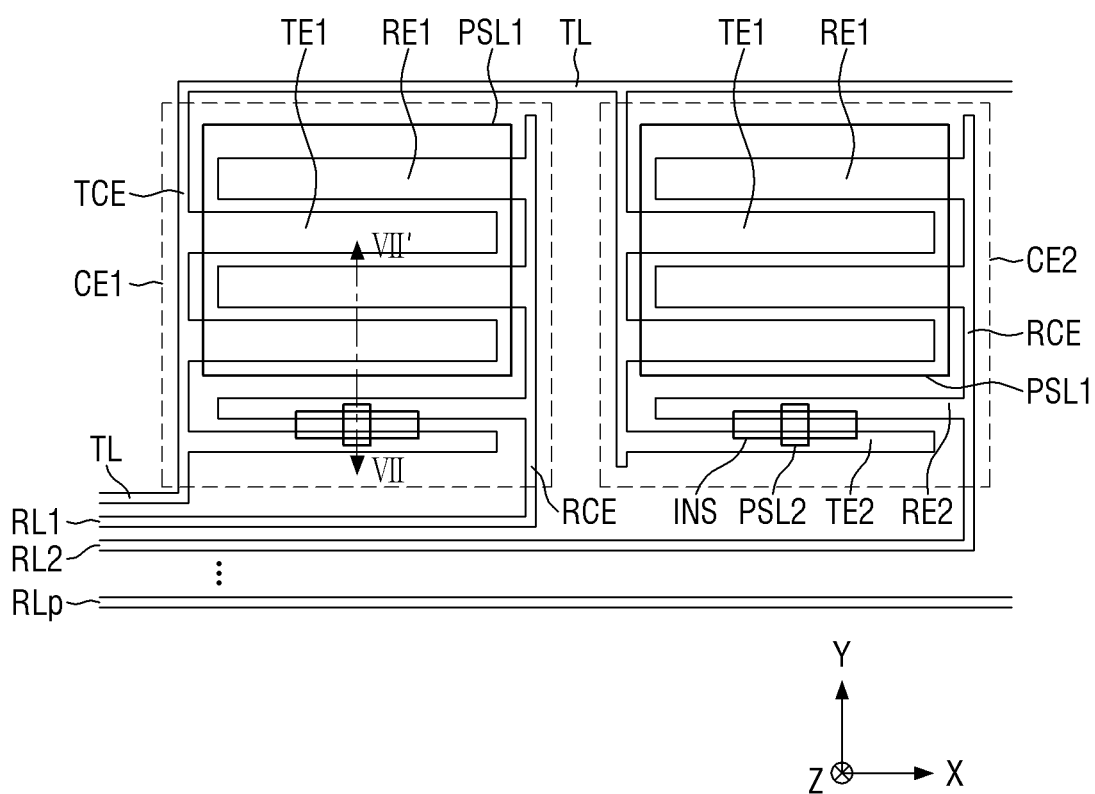
FIG. 18 is a plan view showing still another example of the area A of FIG. 1.
Figure 19:
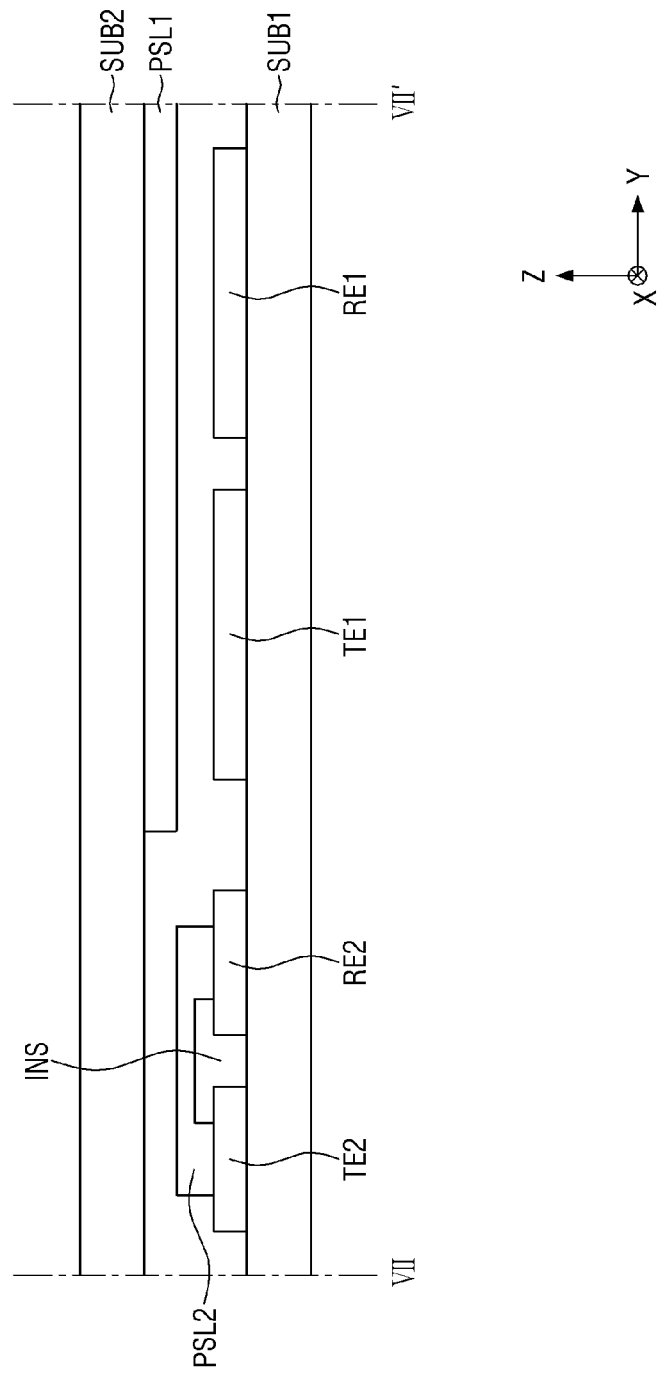
FIG. 19 is an example of a cross-sectional view taken along the line VII-VII' of FIG. 18.

FIG. 18 is a plan view showing still another example of the area A of FIG. 1. FIG. 19 is an example of a cross-sectional view taken along the line VII-VII' of FIG. 18.

The features shown in FIGS. 18 and 19 are different from the features shown in FIGS. 16 and 17 in that the width of the first driving electrode TE1 and the width of the first sensing electrode RE1 are formed to be wider than the width of the second driving electrode TE2 and the width of the second sensing electrode RE2. In FIGS. 18 and 19, some repetitive description with respect to the features shown in FIGS. 5 and 6 may be omitted.

Referring to FIGS. 18 and 19, the width of the second driving electrode TE2 and the width of the second sensing electrode RE2 are set to have a third width w3, and the width of the first driving electrode TE1 and the width of the first sensing electrode RE1 are set to have a fourth width w4 wider than the third width w3.

When the width of the first driving electrode TE1 and the width of the first sensing electrode RE1 increase, the number of the first driving electrodes TE1 and the first sensing electrodes RE1 overlapping the first force sensing layer PSL1 in the same area decreases. When the number of the first driving electrodes TE1 and the first sensing electrodes RE1 overlapping the first force sensing layer PSL1 increases, the contact uniformity between the first force sensing layer PSL1 and the first sensing electrode RE1 may be lowered, and thus the degree of resistance scattering of the force sensing layer may increase.

According to the embodiment of FIGS. 18 and 19, the width of the first driving electrode TE1 and the width of the first sensing electrode RE1 increase, so that the number of the first driving electrodes TE1 and the first sensing electrodes RE1 overlapping the first force sensing layer PSL1 may decrease. Therefore, it may be possible to prevent or reduce the contact uniformity between the first force sensing layer PSL1 and the first sensing electrode RE1 from decreasing, and it may be possible to prevent or reduce the degree of resistance scattering of the force sensing layer from increasing.

Figure 20:
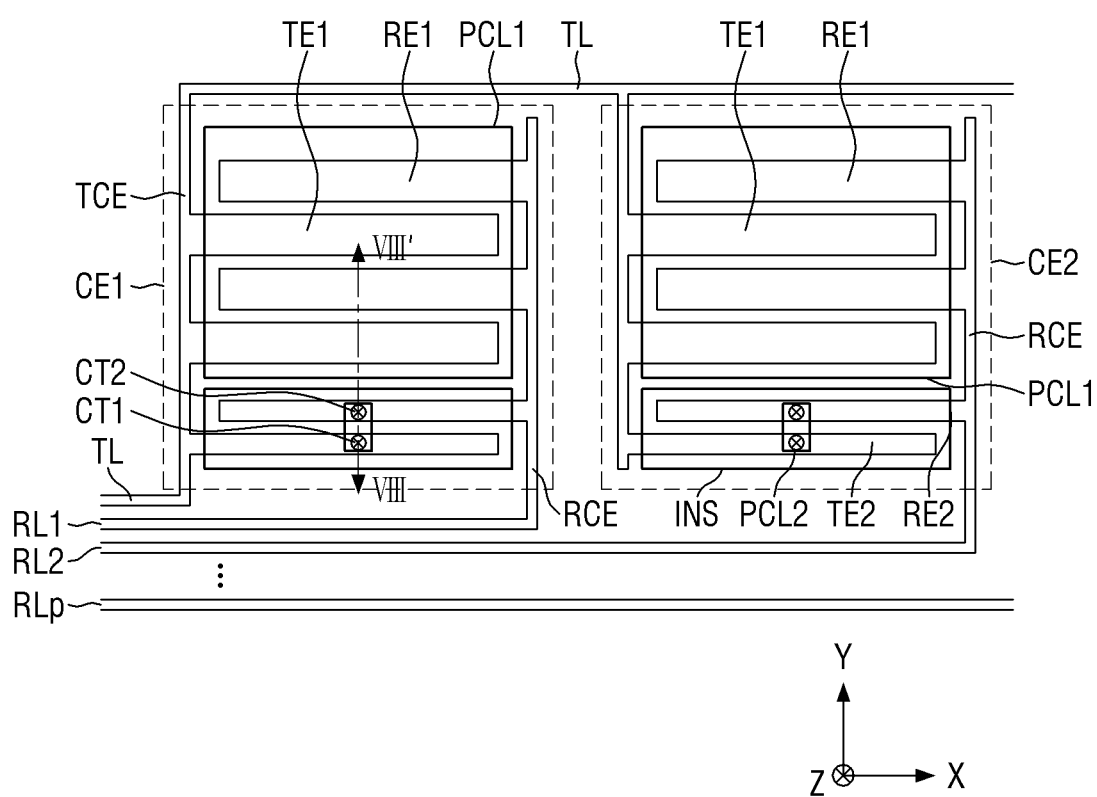
FIG. 20 is a plan view showing still another example of the area A of FIG. 1.
Figure 21:
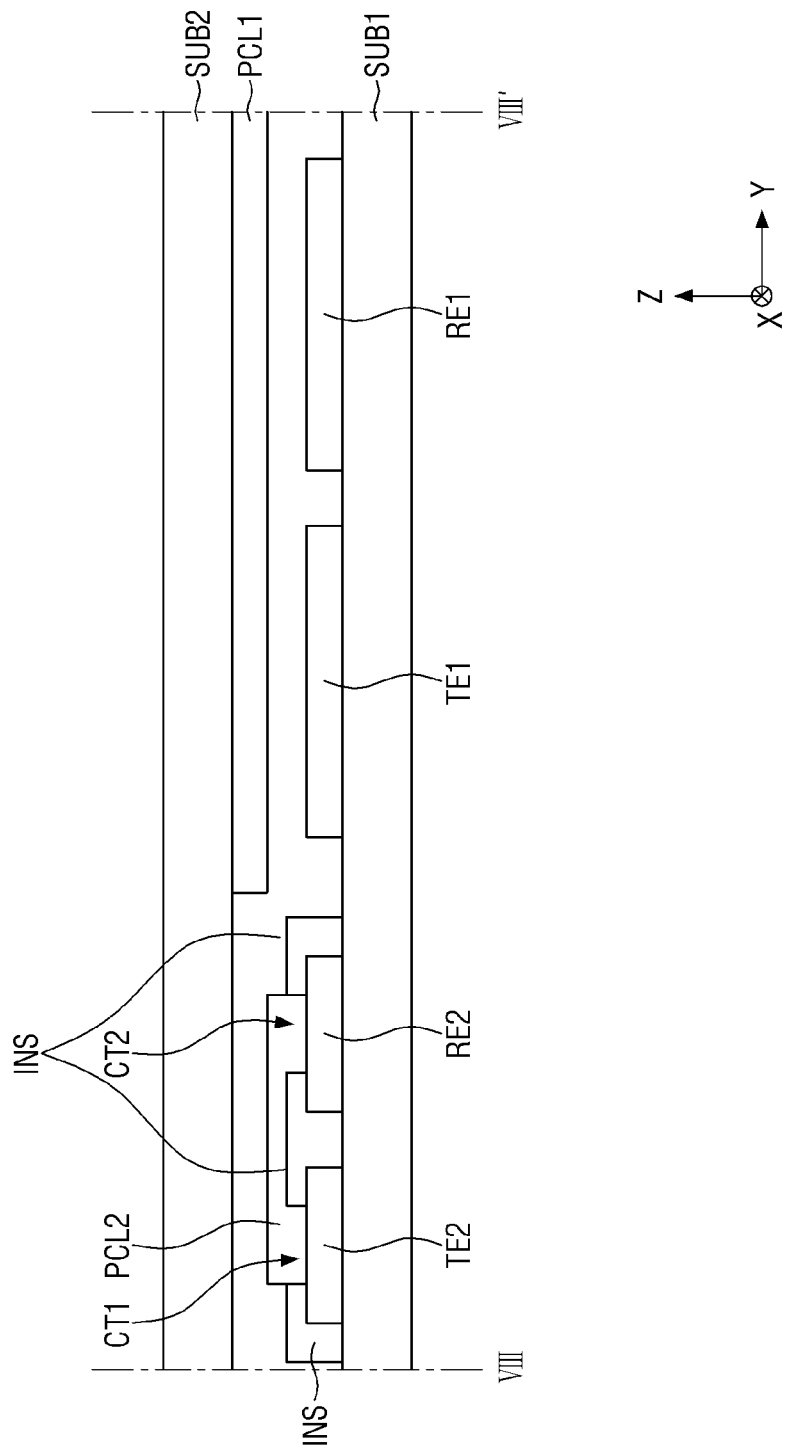
FIG. 21 is an example of a cross-sectional view taken along the line VIII-VIII' of FIG. 20.

FIG. 20 is a plan view showing still another example of the area A of FIG. 1. FIG. 21 is an example of a cross-sectional view taken along the line VIII-VIII' of FIG. 20.

The features shown in FIGS. 20 and 21 are different from the features shown in FIGS. 18 and 19 in that the second force sensing layer PSL2 is connected to the second driving electrode TE2 through a first contact hole CT1, and is connected to the second sensing electrode RE2 through a second contact hole CT2. In FIGS. 20 and 21, some repetitive description with respect to the features shown in FIGS. 18 and 19 may be omitted.

Referring to FIGS. 20 and 21, the insulating film INS is formed to cover the second driving electrode TE2 and the second sensing electrode RE2. The insulating film INS may be located in a space between the side surfaces of the second sensing electrode RE2 facing the second driving electrode TE2. The insulating film INS may be formed of an inorganic material or an organic material, which is an electrically insulating material.

The second force sensing layer PSL2 is formed to cover a part of the upper surface of the insulating film INS. The second force sensing layer PSL2 may be in contact with the second driving electrode TE2 through the first contact hole CT1 penetrating the insulating film INS and exposing the second driving electrode TE2. The second force sensing layer PSL2 may be in contact with the second sensing electrode RE2 through the second contact hole CT2 penetrating the insulating film INS and exposing the second sensing electrode RE2.

According to the embodiment shown in FIGS. 20 and 21, the second force sensing layer PSL2 is not formed on the side surfaces of the second driving electrode TE2 and the side surfaces of the second sensing electrode RE2, so that it is possible to prevent the resistance scattering of the force sensing layer from occurring due to the side inclination angle of the second driving electrode TE2 and the side inclination angle of the second sensing electrode RE2.

Meanwhile, the width of the first driving electrode TE1 and the width of the first sensing electrode RE1 may be set to be greater than the width of the second driving electrode TE2 and the width of the second sensing electrode RE2 as shown in FIGS. 20 and 21, but the present invention is not limited thereto. The width of the first driving electrode TE1 and the width of the first sensing electrode RE1 may be set to be narrower than or equal to the width of the second driving electrode TE2 and the width of the second sensing electrode RE2 as shown in FIGS. 16 and 17.

Figure 22:
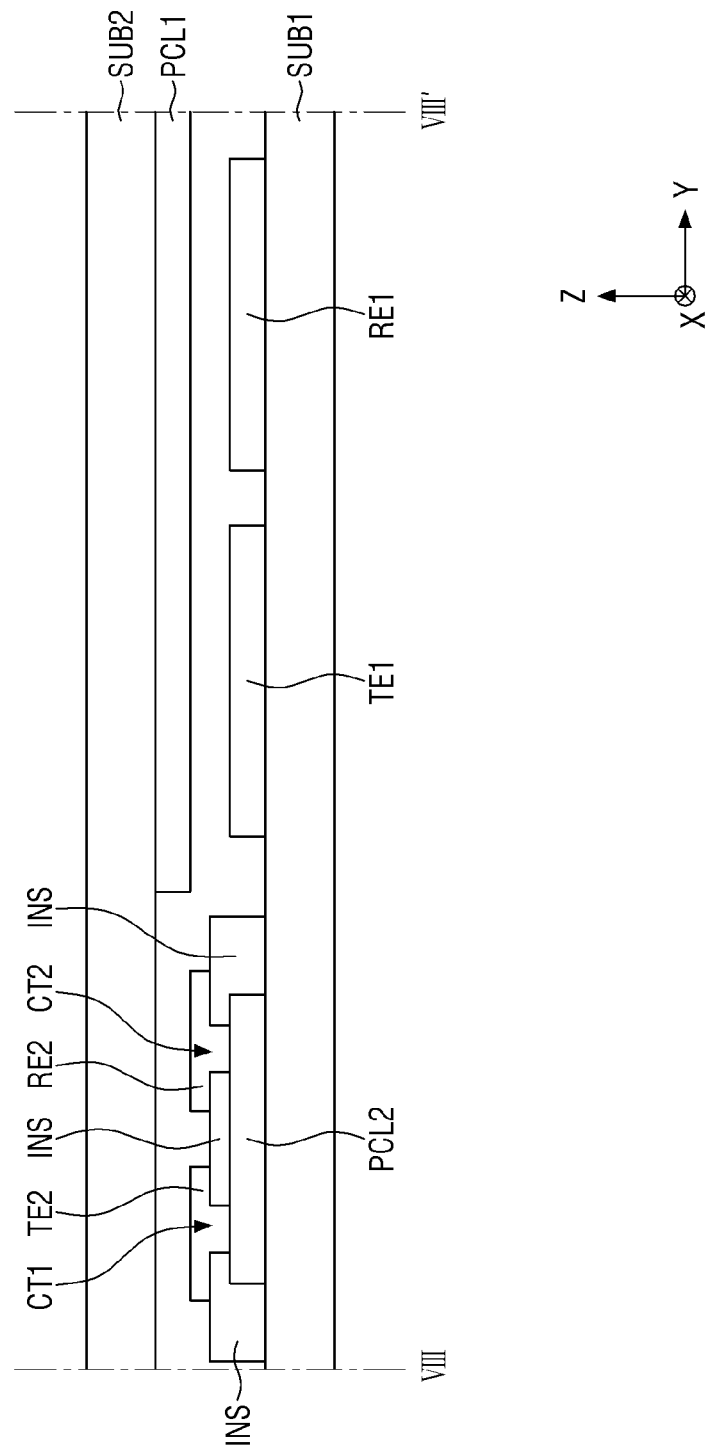
FIG. 22 is another example of a cross-sectional view taken along the line VIII-VIII' of FIG. 20.

FIG. 22 is another example of a cross-sectional view taken along the line VIII-VIII' of FIG. 20.

The features shown in FIG. 22 are different from the features shown in FIGS. 20 and 21 in that the second force sensing layer PSL2 is located beneath the insulating film INS, and the second driving electrode TE2 and the second sensing electrode RE2 are located on the insulating film INS. In FIG. 22, some repetitive description with respect to the features shown in FIGS. 20 and 21 may be omitted.

Referring to FIG. 22, the second force sensing layer PSL2 is located on the first substrate SUB1, and the insulating film INS is located on the second force sensing layer PSL2. The insulating film INS may be formed to cover the second force sensing layer PSL2. The insulating film INS may be formed of an inorganic material or an organic material, which is an electrically insulating material.

The second driving electrode TE2 and the second sensing electrode RE2 are formed on the insulating film INS. The second driving electrode TE2 may be in contact with the second force sensing layer PSL2 through the first contact hole CT1 penetrating the insulating film INS and exposing the second force sensing layer PSL2. The second sensing electrode RE2 may be in contact with the second force sensing layer PSL2 through the second contact hole CT2 penetrating the insulating film INS and exposing the second force sensing layer PSL2.

According to the embodiment shown in FIG. 22, the second force sensing layer PSL2 is not formed on the side surfaces of the second driving electrode TE2 and the side surfaces of the second sensing electrode RE2, so that it is possible to prevent the resistance scattering of the force sensing layer from occurring due to the side inclination angle of the second driving electrode TE2 and the side inclination angle of the second sensing electrode RE2.

Meanwhile, the width of the first driving electrode TE1 and the width of the first sensing electrode RE1 may be set to be greater than the width of the second driving electrode TE2 and the width of the second sensing electrode RE2 as shown in FIG. 22, but the present invention is not limited thereto. The width of the first driving electrode TE1 and the width of the first sensing electrode RE1 may be set to be narrower than or equal to the width of the second driving electrode TE2 and the width of the second sensing electrode RE2 as shown in FIGS. 16 and 17.

Figure 23:
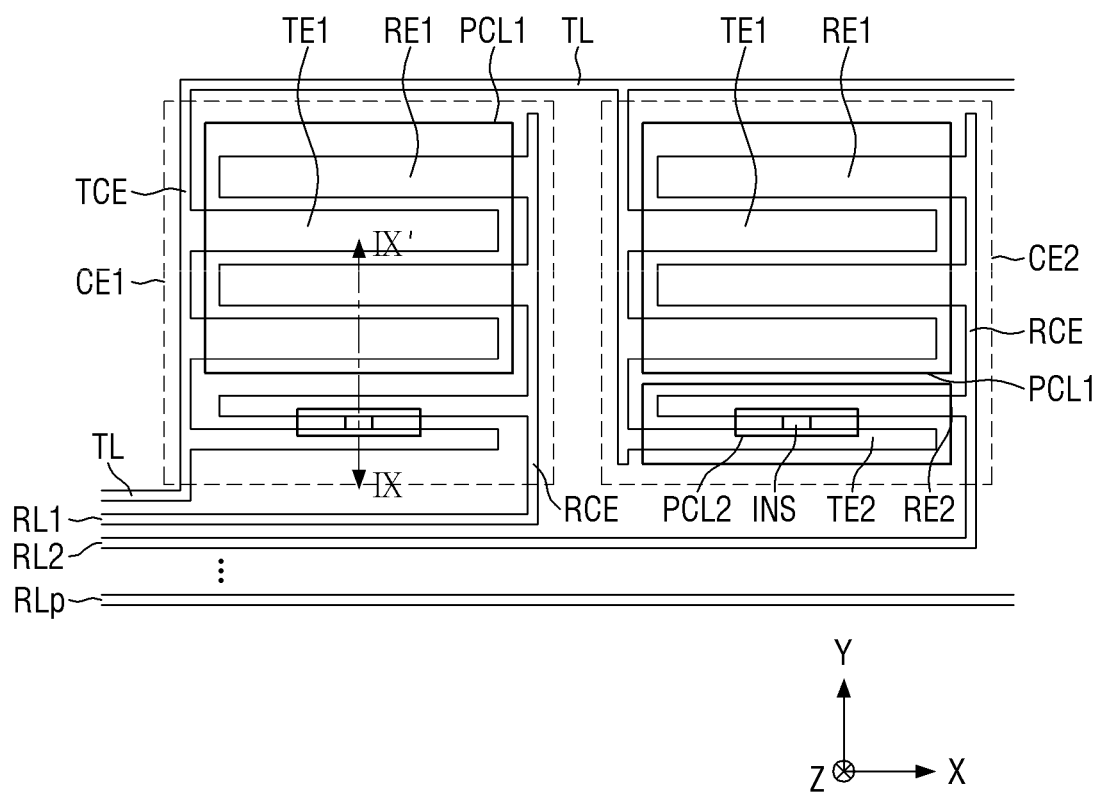
FIG. 23 is a plan view showing still another example of the area A of FIG. 1.
Figure 24:
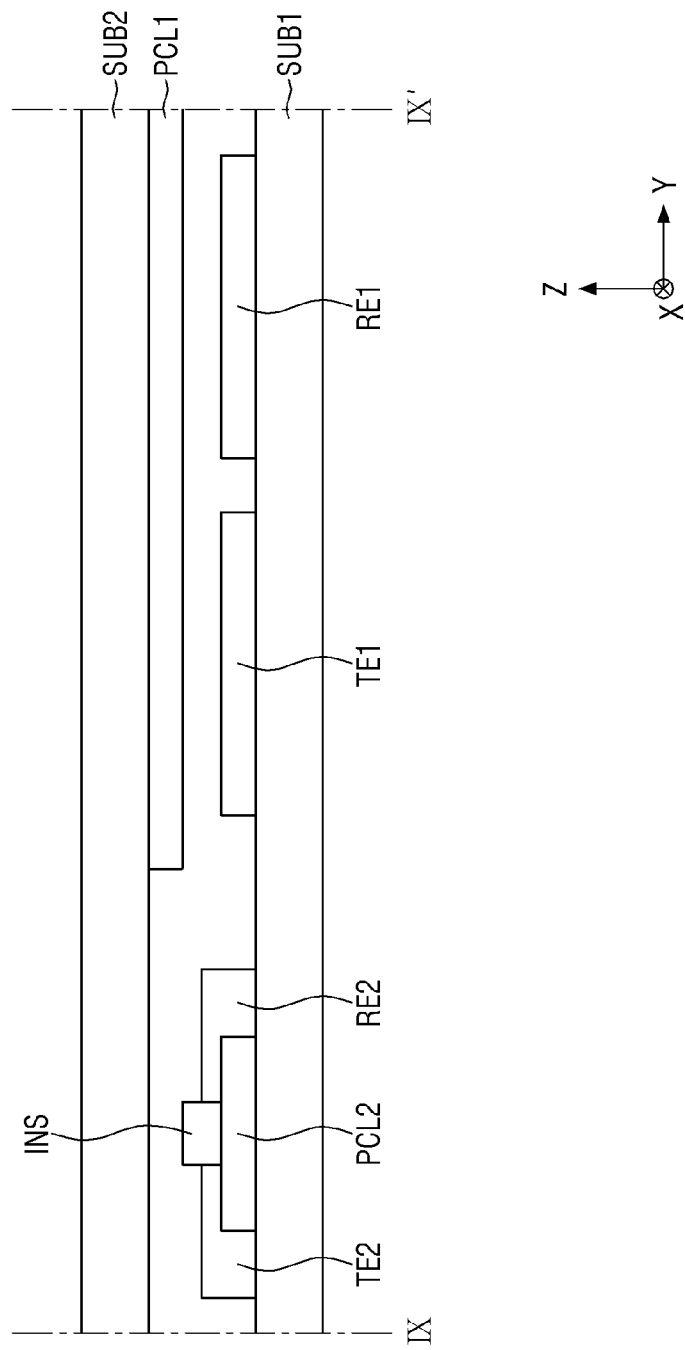
FIG. 24 is an example of a cross-sectional view taken along the line IX-IX' of FIG. 23.

FIG. 23 is a plan view showing still another example of the area A of FIG. 1. FIG. 24 is an example of a cross-sectional view taken along the line IX-IX' of FIG. 23.

The features shown in FIGS. 23 and 24 are different from the features shown in FIGS. 18 and 19 in that the second force sensing layer PSL2 is located beneath the second driving electrode TE2 and the second sensing electrode RE2, and the second driving electrode TE2 and the second sensing electrode RE2 are in contact with the second force sensing layer PSL2 without a contact hole. In FIGS. 23 and 24, some repetitive description overlapping the features shown in FIGS. 18 and 19 may be omitted.

Referring to FIGS. 23 and 24, the second force sensing layer PSL2 is located on the first substrate SUB1, and the insulating film INS is located on a part of the upper surface of the second force sensing layer PSL2. The insulating film INS may be formed of an inorganic material or an organic material, which is an electrically insulating material.

The second driving electrode TE2 may be formed to cover another part of the upper surface of the exposed second force sensing layer PSL2 not covered by the insulating film INS and any one side surface of the exposed second force sensing layer PSL2. Further, the second sensing electrode RE2 may be formed to cover another part of the upper surface of the exposed second force sensing layer PSL2 not covered by the insulating film INS and the other side surface of the exposed second force sensing layer PSL2. One side and the other side of the second force sensing layer PSL2 may be located to face each other. Moreover, the second driving electrode TE2 and the second sensing electrode RE2 may be located on the first substrate SUB1.

According to the embodiment shown in FIGS. 23 and 24, the second force sensing layer PSL2 is not formed on the side surfaces of the second driving electrode TE2 and the side surfaces of the second sensing electrode RE2, so that it is possible to resistance scattering of the force sensing layer may be prevented from occurring due to the side inclination angle of the second driving electrode TE2 and the side inclination angle of the second sensing electrode RE2.

Meanwhile, the width of the first driving electrode TE1 and the width of the first sensing electrode RE1 are set to be greater than the width of the second driving electrode TE2 and the width of the second sensing electrode RE2 as shown in FIGS. 23 and 24, but the present invention is not limited thereto. The width of the first driving electrode TE1 and the width of the first sensing electrode RE1 may be set to be narrower than or equal to the width of the second driving electrode TE2 and the width of the second sensing electrode RE2 as shown in FIGS. 16 and 17.

Figure 25:
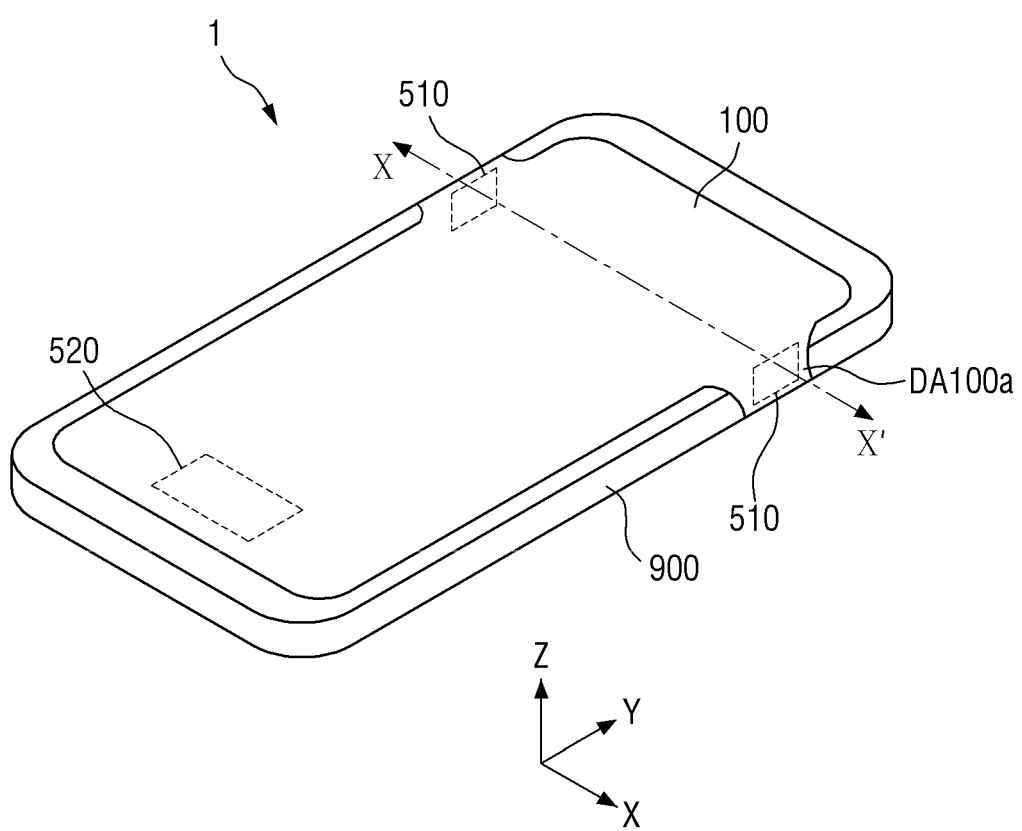
FIG. 25 is a perspective view of a display device according to some example embodiments.
Figure 27:
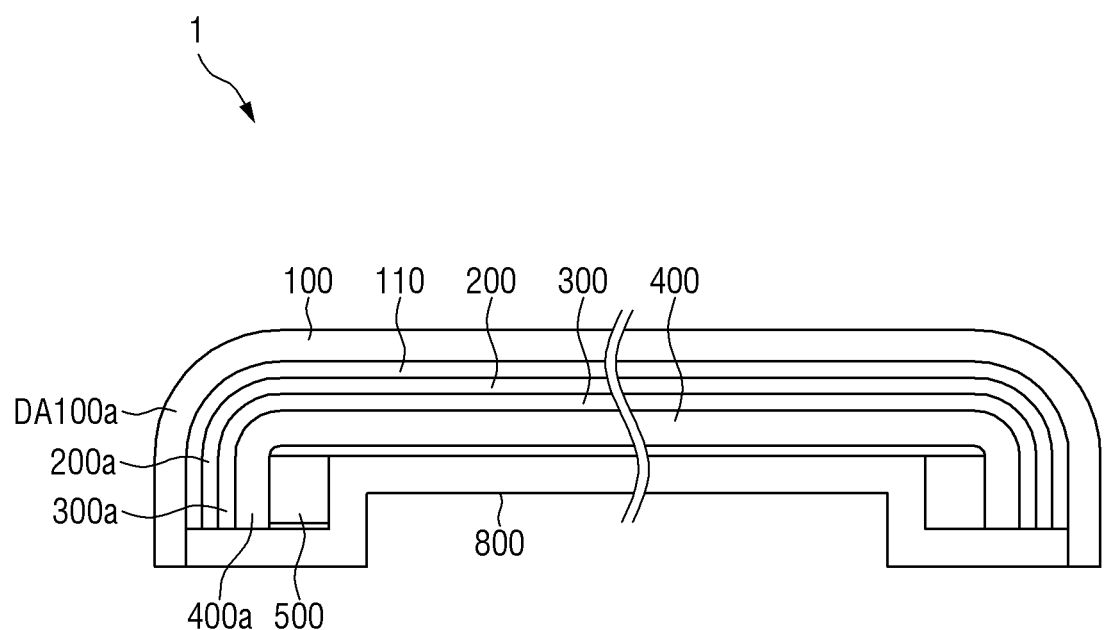
FIG. 27 is an example of a cross-sectional view taken along the line X-X' of FIG. 25.

FIG. 25 is a perspective view of a display device according to an embodiment. FIG. 26 is an exploded perspective view of the display device of FIG. 25. FIG. 27 is an example of a cross-sectional view taken along the line X-X' of FIG. 25.

Referring to FIGS. 25 to 27, a display device 1 according to an embodiment includes a cover window 100, a touch sensing unit 200, a touch circuit board 210, a display panel 300, a display circuit board 310, a panel lower member 400, a first force sensor 510, a second force sensor 520, a lower bracket 800, a main circuit board 910, and a lower cover 900.

As used herein, the "on", "over", "top" and "upper surface" refer to a direction in which the window 100 is located with respect to the display panel 300, that is, a Z-axis direction, and the "beneath", "under", "bottom" and "lower surface" refer to a direction in which the panel lower member 400 is located with respect to the display panel 300, that is, a direction opposite to the Z-axis direction.

The display device 1 may have a rectangular shape in a plan view. For example, the display device 1 may have a rectangular planar shape having short sides in the first direction (X-axis direction) and long sides in the second direction (Z-axis direction) as shown in FIG. 1A. The corners where the short sides in the first direction (X-axis direction) meet the long sides in the second direction (Z-axis direction) may be formed to be round or linear so as to have a predetermined curvature as shown in FIG. 25. The planar shape of the display device 1 is not limited to a rectangular shape, and may be another polygonal shape, a circular shape, or an elliptical shape.

The cover window 100 may be located on the display panel 300 so as to cover the upper surface of the display panel 300. Thus, the cover window 100 may function to protect the upper surface of the display panel 300. The cover window 100 may be attached to the touch sensing unit 200 through an adhesive layer 110 as shown in FIG. 27. The adhesive layer 110 may be an optically clear adhesive (OCA) film or an optically clear resin (OCR) film.

The cover window 100 may include a light transmitting portion DA100 corresponding to a display area DA of the display panel 300 and a light blocking portion NDA100 corresponding to a non-display area NDA of the display panel 300. The light blocking portion NDA100 of the cover window 100 may be formed to be opaque. Or, the light blocking portion NDA100 of the cover window 100 may be formed as a decorative layer having a pattern that can be seen to a user when an image is not displayed. For example, a company logo such as "SAMSUNG" or various characters may be patterned on the light blocking portion NDA100 of the cover window 100.

The cover window 100 may be made of glass, sapphire, and/or plastic. The cover window 100 may be rigid or flexible.

The touch sensing unit 200 including touch sensors for sensing a user's touch may be located between the cover window 100 and the display panel 300. The touch sensing unit 200 is a unit for sensing a touch position of a user, and may be implemented as a capacitive type such as a self-capacitance type or a mutual capacitance type, or may be implemented as an infrared type.

The touch sensing device 200 may be formed in the shape of a panel or a film. The touch sensing unit 200 may be formed integrally with the display panel 300. For example, when the touch sensing unit 200 is formed in the shape of a film, it may be formed integrally with a barrier film for encapsulating the display panel 300.

The touch circuit board 210 may be attached to one side of the touch sensing unit 200. For example, the touch circuit board 210 may be attached onto pads provided on one side of the touch sensing unit 200 using an anisotropic conductive film. Further, the touch circuit board 210 may be provided with a touch connection portion, and the touch connection portion may be connected to a connector of the display circuit board 310. The touch circuit board may be a flexible printed circuit board or a chip on film.

The touch driving unit 220 may apply touch driving signals to the touch sensing unit 200, sense sensing signals from the touch sensing unit 200, and analyze the sensing signals to calculate a touch position of the user. The touch driving unit 220 may be formed as an integrated circuit and mounted on the touch circuit board 210.

The display panel 300 may include a display area DA and a non-display area NDA. The display area DA is an area in which an image is displayed, and the non-display area NDA is an area in which no image is displayed, and may be a peripheral area of the display area NDA. The non-display area NDA may be located to surround the display area DA as shown in FIGS. 25 and 26, but the present invention is not limited thereto. The display area DA may overlap the light transmitting portion 100DA of the cover window 100, and the non-display area NDA may overlap the light blocking portion 100NDA of the cover window 100.

The display panel 300 may be a light emitting display panel including a light emitting element. For example, the display panel 300 includes an organic light emitting display panel using an organic light emitting diode, an ultra-small light emitting diode display panel using a micro LED, or a quantum dot light emitting diode display panel using a quantum dot light emitting diode. Hereinafter, the display panel 300 will be mainly described as an organic light emitting display panel as shown in FIG. 28.

The display area DA of the display panel 300 indicates an area where a light emitting element layer 304 is formed to display an image, and the non-display area NDA indicates a peripheral area of the display area DA.

Figure 28:
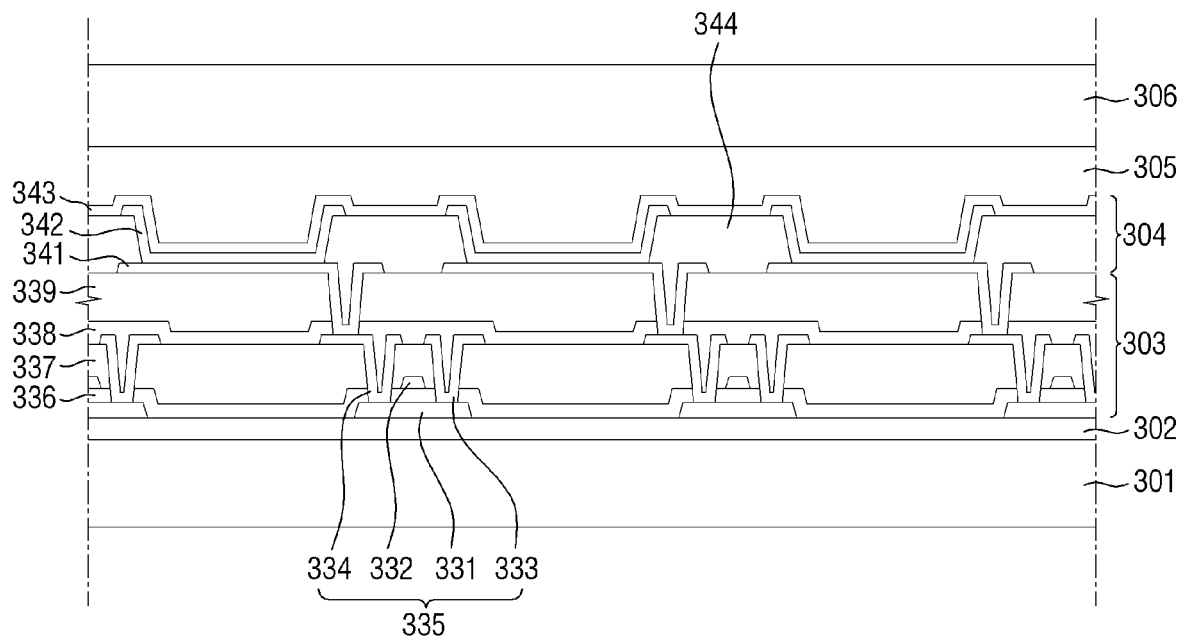
FIG. 28 is a cross-sectional view showing a display area of the display panel of FIG. 27.

As shown in FIG. 28, the display panel 300 includes a support substrate 301, a flexible substrate 302, a thin film transistor layer 303, a light emitting element layer 304, an encapsulating layer 305, and a barrier film 306.

The flexible substrate 302 is located on the support substrate 301. Each of the support substrate 301 and the flexible substrate 302 may include a polymer material having flexibility. For example, each of the support substrate 301 and the flexible substrate 302 may include polyethersulphone (PES), polyacrylate (PA), polyarylate (PAR), polyetherimide (PEI), polyethylenenapthalate (PEN), polyethyleneterephthalate (PET), polyphenylenesulfide (PPS), polyallylate, polyimide (PI), polycarbonate (PC), cellulosetriacetate (CAT), cellulose acetate propionate (CAP), or a combination thereof.

The thin film transistor layer 303 is formed on the flexible substrate 302. The thin film transistor layer 303 includes thin film transistors 335, a gate insulating film 336, an interlayer insulating film 337, a protective film 338, and a planarization film 339.

A buffer film may be formed on the flexible substrate 302. The buffer film may be formed on the flexible substrate 302 so as to protect thin film transistors 335 and light emitting elements from moisture penetrating through the support substrate 301 and the flexible substrate 302 which are vulnerable to moisture. The buffer film may be formed of a plurality of alternately laminated inorganic films. For example, the buffer film may be formed of a multi-layer film in which one or more inorganic layers including one or more of a silicon oxide (SiOx), a silicon nitride (SiNx), and SiON are alternately stacked. The buffer film may be omitted.

The thin film transistor 335 is formed on the buffer film. The thin film transistor 335 includes an active layer 331, a gate electrode 332, a source electrode 333, and a drain electrode 334. Although it is shown in FIG. 28 that the thin film transistor 335 is formed by a top gate manner in which the gate electrode 332 is located on the active layer 331, it should be noted that the present invention is not limited thereto. That is, the thin film transistor 335 may be formed by a bottom gate manner in which the gate electrode 332 is located beneath the active layer 331, or may be formed by a double gate manner in which the gate electrode 332 is located both on and beneath the active layer 331.

The active layer 331 is formed on the buffer film. The active layer 331 may be formed of a silicon-based semiconductor material or an oxide-based semiconductor material. A light blocking layer for blocking external light incident on the active layer 331 may be formed between the buffer film and the active layer 331.

A gate insulating film 336 may be formed on the active layer 331. The gate insulating film 316 may be formed of an inorganic film, for example, a silicon oxide (SiOx) film, a silicon nitride (SiNx) film, or a combination thereof.

The gate electrode 332 and a gate line may be formed on the gate insulating film 336. The gate electrode 332 and the gate line may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof.

The interlayer insulating film 337 may be formed on the gate electrode 332 and the gate line. The interlayer insulating film 337 may be formed of an inorganic film, for example, a silicon oxide (SiOx) film, a silicon nitride (SiNx) film, or a combination thereof.

The source electrode 333, the drain electrode 334, and a data line may be formed on the interlayer insulating film. Each of the source electrode 333 and the drain electrode 334 may be connected to the active layer 331 through a contact hole penetrating the gate insulating film 336 and the interlayer insulating film 337. The source electrode 333, the drain electrode 334, and the data line may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof.

The protective film 338 for insulating the thin film transistor 335 may be formed on the source electrode 333, the drain electrode 334, and the data line. The interlayer insulating film 338 may be formed of an inorganic film, for example, a silicon oxide (SiOx) film, a silicon nitride (SiNx) film, or a combination thereof.

The planarization film 339 for flattening a step due to the thin film transistor 335 may be formed on the protective film 338. The planarization film 339 may be formed of an organic film including an acryl resin, an epoxy resin, a phenolic resin, a polyamide resin, or a polyimide resin.

The light emitting element layer 304 is formed on the thin film transistor layer 303. The light emitting element layer 304 includes light emitting elements and a pixel defining film 344.

The light emitting elements and the pixel defining film 344 are formed on the planarization film 339. The light emitting element may be an organic light emitting element. In this case, the light emitting element may include an anode electrode 341, a light emitting layer 342, and a cathode electrode 343.

The anode electrode 341 may be formed on the planarization film 339. The anode electrode 341 may be connected to the source electrode 333 of the thin film transistor 335 through a contact hole penetrating the protective film 338 and the planarization film 339.

The pixel defining film 344 may be formed on the planarization film 339 to cover the edge of the anode electrode 341 so as to partition pixels. That is, the pixel defining film 344 serves to define pixels. Each of the pixels refers to an area where the anode electrode 341, the light emitting layer 342, and the cathode electrode 343 are sequentially laminated, and holes from the anode electrode 341 and electrons from the cathode electrode 343 are combined with each other in the light emitting layer 342 to emit light.

The light emitting layer 342 is formed on the anode electrode 341 and the pixel defining film 344. The light emitting layer 342 is an organic light emitting layer. The light emitting layer 342 may emit one of red light, green light, and blue light. The peak wavelength range of red light may be about 620 nm to 750 nm, and the peak wavelength range of green light may be about 495 nm to 570 nm. Further, the peak wavelength range of blue light may be about 450 nm to 495 nm. The light emitting layer 342 may be a white light emitting layer that emits white light. In this case, the light emitting layer 342 may have a laminate structure of a red light emitting layer, a green light emitting layer, and a blue light emitting layer, and may be a common layer formed commonly in the pixels. In this case, the display panel 300 may further include color filters for displaying red, green, and blue colors.

The light emitting layer 342 may include a hole transporting layer, a light emitting layer, and an electron transporting layer. Further, the light emitting layer 342 may be formed to have a tandem structure of two stacks or more, and in this case, a charge generating layer may be formed between the stacks.

The cathode electrode 343 is formed on the light emitting layer 342. The second electrode 343 may be formed to cover the light emitting layer 342. The second electrode 343 may be a common layer formed commonly in the pixels.

When the light emitting element layer 304 is formed by a top emission manner in which light is emitted upward, the anode electrode 341 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. The APC alloy may be an alloy of silver (Ag), palladium (Pd), and copper alloy (Cu). The cathode electrode 263 may be formed of a transparent conductive material (TCO) such as ITO or IZO, which is light-transmissive, or a semi-transmissive conductive material such as magnesium (Mg), silver (Ag), or an alloy of magnesium (Mg) and silver (Ag). When the cathode electrode 343 is formed of a semi-transmissive conductive material, light emission efficiency may be increased by a microcavity.

When the light emitting element layer 304 is formed by a bottom emission manner in which light is emitted downward, the anode electrode 341 may be formed of a transparent conductive material (TCO) such as ITO or IZO, or a semi-transmissive conductive material such as magnesium (Mg), silver (Ag), or an alloy of magnesium (Mg) and silver (Ag). The second electrode 343 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. When the anode electrode 341 is formed of a semi-transmissive conductive material, light emission efficiency may be increased by a microcavity.

The encapsulation layer 305 is formed on the light emitting element layer 304. The encapsulation layer 305 serves to prevent oxygen or moisture from permeating the light emitting layer 342 and the cathode electrode 343. For this purpose, the encapsulation layer 305 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. The encapsulation layer 305 may further include at least one organic film. The organic film may be formed to have a sufficient thickness to prevent foreign matter (particles) from penetrating the encapsulation layer 305 and entering the light emitting layer 342 and the cathode electrode 343. The organic film may include any one of epoxy, acrylate, and urethane acrylate.

The barrier film 306 is located d on the encapsulation layer 305. The barrier film 306 is located to cover the encapsulation layer 305 so as to protect the light emitting element layer 304 from oxygen and moisture. The barrier film 306 may be formed integrally with the touch sensing unit 200.

A polarizing film may be further attached onto the upper surface of the display panel 300 to prevent the deterioration of visibility due to external light reflection.

The display circuit board 310 may be attached to one side of the display panel 300. For example, the display circuit board 310 may be attached onto pads provided on one side of the display panel 300 using an anisotropic conductive film.

The touch circuit board 210 and the display circuit board 310 may be bent downward from the upper portion of the display panel 300 as shown in FIG. 26. The display circuit board 310 may be connected to the touch connection portion of the touch circuit board 210 through a connector. The display circuit board 310 may include pads corresponding to the connector instead of the connector, and, in this case, the display circuit board 310 may be connected to the touch circuit board 210 using an anisotropic conductive film. The display circuit board 310 may be connected to the main circuit board 910 through another connector 340.

The display driving unit 320 outputs signals and voltages for driving the display panel 300 through the display circuit board 310. The display driving unit 320 may be formed as an integrated circuit and mounted on the display circuit board 310, but the present invention is not limited thereto.

For example, the display driving unit 320 may be attached to one side of the display panel 300.

The panel lower member 400 may be arranged on the lower surface of the display panel 300. The panel lower member 400 may include at least one of a heat dissipating layer for efficiently emitting heat of the display panel 300, an electromagnetic wave blocking layer for blocking electromagnetic waves, a light blocking layer for blocking external light, a light absorbing layer for absorbing external light, and a buffer layer for absorbing an external impact.

For example, the panel lower member 400 may include a light absorbing member, a buffer member, and a heat dissipating member.

The light absorbing member may be located under the display panel 300. The light absorbing member inhibits the transmission of light to prevent components located under the light absorbing member, that is, a first force sensor 510 and a second force sensor 520 from being viewed from above the display panel 300. The light absorbing member may include a light absorbing material such as a black pigment or a dye.

The buffer member may be located under the light absorbing member. The buffer member absorbs an external impact to prevent the display panel 300 from being damaged. The buffer member may include a single layer or a plurality of layers. For example, the buffer member may be formed of a polymer resin such as polyurethane, polycarbonate, polypropylene, or polyethylene, or may be formed of an elastic material such as a rubber, a urethane material, or a sponge formed by foaming an acrylic material. The buffer member may be a cushion layer.

The heat dissipating member may be located under the buffer member. The heat dissipating member may include at least one heat dissipating layer. For example, the heat dissipating member may include a first heat dissipating layer including graphite or carbon nanotubes and a second heat dissipating layer capable of blocking electromagnetic waves and formed of a metal thin film of copper, nickel, ferrite or silver having excellent thermal conductivity.

The display panel 300 may include a panel protrusion portion 300a protruding from at least one side surface thereof. For example, the display panel 300, as shown in FIG. 26, may include a panel protrusion portion 300a protruding from each of left and right side surfaces thereof.

The panel protrusion portion 300a may protrude from the side surface of the display panel 300 and be bent. Further, the panel protrusion portion 300a may be provided thereon with a display area DA including the light emitting element layer 304 to display an image. In this case, an image displayed on the panel protrusion portion 300a may be seen from the side of the display device 1.

The touch sensing unit 200 may include a touch protrusion portion 200a overlapping the panel protrusion portion 300a of the display panel 300. The touch protrusion portion 200a may be provided with touch sensors for sensing a user's touch.

The cover window 100 may include a side light transmitting portion DA100a formed in an area overlapping the panel protrusion portion 300a such that the panel protrusion portion 300a is seen from the side of the display device 1. The panel protrusion portion 300a may be seen through the side light transmitting portion DA100a.

The panel lower member 400 may include a lower protrusion 400a overlapping the panel protrusion portion 300a. The lower protrusion portion 400a of the panel lower member 400 may be provided with a light absorbing member, a buffer member, and a light dissipating layer.

The first force sensor 510 may be located under the lower protrusion portion 400a. For example, the second substrate SUB2 located on the upper surface of the first force sensor 510 may be attached to the lower surface of the lower protrusion portion 400a. Thus, the first force sensor 510 may sense a force applied to the side light transmitting portion DA100a of the cover window 100.

The second force sensor 520 may be located under the panel lower member 400. The second force sensor 520 may be located adjacent to one side of the panel lower member 400. The second force sensor 520 may sense a force applied to the side light transmitting portion DA100a of the cover window 100.

The first force sensor 510 and the second force sensor 520 may be used as substitutes for physical buttons of the display device 1.

For example, the first force sensor 510 attached to the lower protrusion portion 400a of the first side of the panel lower member 400 may be used as a substitute for a power button of the display device 1, and the first force sensor 510 attached to the lower protrusion portion 400a of the second side of the panel lower member 400 may be used as a substitute for a sound control button of the display device 1. That is, when the first force sensor 510 attached to the lower protrusion portion 400a of the first side of the panel lower member 400 senses a first force, the screen of the display device 1 may be turned off. Or, when the first force sensor 510 attached to the lower protrusion portion 400a of the first side of the panel lower member 400 senses a second force higher than the first force or senses the first force for a predetermined period of time, a screen which can select a power off of the display device 1 may be displayed. Further, when the first pressuring sensing cell of the first force sensor 510 attached to the lower protrusion portion 400a of the second side of the panel lower member 400 senses a first force, the sound of the display device 1 may be decreased, and when the second pressuring sensing cell of the first force sensor 510 senses a second force, the sound of the display device 1 may be increased.

Further, when the second force sensor 520 located adjacent to one side of the panel lower member 400 may be used as a substitute for a home button of the display device. That is, when the second force sensor 520 located adjacent to one side of the panel lower member 400 senses a first force, the screen of the display device 1 may be turned on.

The first force sensor 510 and the second force sensor 520 may be implemented as the force sensor 10 having been described with reference to FIGS. 1 to 24.

The lower bracket 800 may be located under the panel lower member 400. The lower bracket 800 may include a synthetic resin, a metal, or both a synthetic resin and a metal.

For example, the lower bracket 800 may be located to surround the cover window 100, the touch sensing unit 200, the display panel 300, the panel lower member 400, the first force sensor 510, the second force sensor 520, the touch circuit board 210, the display circuit board 310, and the like. In particular, the lower bracket 800 is attached to the lower portion of the side window DA100a as shown in FIG. 27, and may have a stepped cross-sectional shape due to the touch protrusion portion 200a, the panel protrusion portion 300a, the lower protrusion portion 400a, and the first force sensor 510. The lower bracket 800 may be located to surround one end of the touch protrusion portion 200a, one end of the panel protrusion portion 300a, one end of the lower protrusion portion 400a, one side surface and lower surface of the first force sensor 510, and the lower surface of the panel lower member 400. Because the lower bracket 800 may be located on the lower surface of the first force sensor 510 to support the first force sensor 510, the first force sensor 510 may sense a force applied to the side window DA100a.

According to the display device 1 of an embodiment, the side surface of the lower bracket 800 may be exposed to the side surface of the display device 1, or the lower bracket 800 may be omitted and only the lower cover 900 may be provided.

The main circuit board 910 may be located under the lower bracket 800. The main circuit board 910 may be connected to another connector of the display circuit board 310 through a cable connected to a main connector 990. Thus, the main circuit board 910 may be electrically connected to the display circuit board 310 and the touch circuit board 210. Further, when the force sensing circuit board FSCB shown in FIG. 1 is connected to the display circuit board 310 or the touch circuit board 210, the main circuit board 910 may be electrically connected to the force sensing circuit board FSCB. The main circuit board 910 may be a printed circuit board or a flexible printed circuit board.

The main circuit board 910 may include a main processor 920 and a camera device 960 as shown in FIG. 26. Although it is shown in FIG. 26 that the main processor 920, the camera device 960, and the main connector 990 are mounted on one side of the main circuit board 910 facing the lower bracket 800, but the present invention is not limited thereto. That is, the main processor 920, the camera device 960, and the main connector 990 may be mounted on the other side of the main circuit board 910 facing the lower cover 900.

The main processor 920 may control all the functions of the display device 1. For example, the main processor 920 may output image data to the display driving unit 320 of the display circuit board 310 such that the display panel 300 displays an image. Further, the main processor 920 may receive touch data from the touch driving unit 220, determine the touch position of a user, and then execute an application indicated by an icon displayed at the touch position of the user. Further, the main processor 920 may receive force sensing data from the force sensing unit FD, and may control the display device 1 to output a home screen, to control the volume of the sound of the display device 1 or to implement haptic. The main processor 920 may be an application processor, a central processing unit, or a system chip, which includes an integrated circuit.

The camera device 960 processes an image frame such as a still image or a moving image obtained by an image sensor in a camera mode, and outputs the processed image frame to the main processor 920.

In addition, the main circuit board 910 may be further provided with a mobile communication module capable of transmitting and receiving a radio signal to/from at least one of a base station, an external terminal, and a server. The radio signal may include various types of data depending on a voice signal, a video call signal, or a text/multimedia message transmission/reception. Further, the main circuit board 910 may be further provided with an acoustic output device capable of outputting sound and a vibration device capable of generating vibration for haptic implementation.

The lower cover 900 may be located under the lower bracket 800 and the main circuit board 910. The lower cover 900 may form a lower surface appearance of the display device 1. The lower cover 900 may include plastic and/or metal.

As described above, according to the force sensor and display device according to an embodiment, in the force sensor, the contact area of the first force sensing layer with the first driving electrode and the first sensing electrode is changed depending on the applied force, so that the resistance value of the force sensing layer can be changed. Therefore, the force sensor may sense the force applied by a user.

According to the force sensor and display device according to an embodiment, the force sensing layer includes a first resistor whose resistance is changed depending on the force applied by the first force sensing layer and a second resistor defined by the second force sensing layer contacting the second driving electrode and the second sensing electrode, the range of the resistance value of the force sensing layer can be greatly reduced, and the manufacturing cost of the force sensing unit can be reduced.

According to the force sensor and display device according to an embodiment, auxiliary electrodes, such as fine wires or nanowires are arranged on the side surfaces of the second driving electrode and the side surfaces of the second sensing electrode, which are connected to the second force sensing layer, and the second force sensing layer is located on the auxiliary electrodes, so that it is possible to increase the uniformity of the side inclination angle of the second driving electrode and the side inclination angle of the second sensing electrode. Therefore, the degree of resistance scattering of the force sensing layer can be reduced.

According to the force sensor and display device according to an embodiment, the second force sensing layer is not formed on the side surfaces of the second driving electrode and the side surfaces of the second sensing electrode, so that it is possible to prevent the occurrence of resistance scattering of the force sensing layer due to the side inclination angle of the second driving electrode and the side inclination angle of the second sensing electrode.

The effects of the present invention are not limited by the foregoing, and other various effects are anticipated herein.

Although example embodiments of the present invention have been disclosed for illustrative purposes, those skilled in the art will appreciate that various modifications, additions and substitutions are possible, without departing from the scope and spirit of the invention as disclosed in the accompanying claims, and their equivalents.

What is claimed is:

1. A force sensor, comprising:
a first substrate and a second substrate;
a first driving electrode, a second driving electrode, a first sensing electrode, and a second sensing electrode on one surface of the first substrate facing the second substrate;
a first force sensing layer on one surface of the second substrate facing the first substrate; and
a second force sensing layer laterally spaced apart from the first force sensing layer when viewed from a plan view and contacting the second driving electrode and the second sensing electrode regardless of whether a force is applied,
wherein the first force sensing layer overlaps the first driving electrode and the first sensing electrode, and gaps exist between the first force sensing layer and the first driving electrode and between the first force sensing layer and the first sensing electrode,
wherein the first force sensing layer contacts the first driving electrode and the first sensing electrode when the force is applied.

2. The force sensor of claim 1,
wherein the second force sensing layer is on at least one side surface of the second driving electrode and at least one side surface of the second sensing electrode.

3. The force sensor of claim 1, further comprising:
auxiliary electrodes between at least one side surface of the second driving electrode and the second force sensing layer and between at least one side surface of the second sensing electrode and the second force sensing layer.

4. The force sensor of claim 1,
wherein the first driving and the first sensing electrodes are on one surface of the first substrate, the first driving and the first sensing electrodes extend in a first direction, and the first driving and the first sensing electrodes are alternately arranged in a second direction crossing the first direction.

5. The force sensor of claim 4, further comprising:
a driving connection electrode connected to the first driving electrode and the second driving electrode; and
a sensing connection electrode connected to the first sensing electrode and the second sensing electrode.

6. The force sensor of claim 5, further comprising:
a driving line connected to the driving connection electrode and to which a driving voltage is applied; and
a sensing line connected to the sensing connection electrode.

7. The force sensor of claim 4,
wherein the first driving electrode comprises a plurality of first driving electrodes and the second driving electrode comprises a plurality of second driving electrodes and a number of the first driving electrodes is larger than a number of the second driving electrodes, and the first sensing electrode comprises a plurality of first sensing electrodes and the second sensing electrode comprises a plurality of second sensing electrodes and a number of the first sensing electrodes is larger than a number of the second sensing electrodes.

8. The force sensor of claim 4,
wherein the first driving electrode comprises a plurality of first driving electrodes and the second driving electrode comprises a plurality of second driving electrodes and a width of one of the first driving electrodes adjacent to one of the second driving electrodes is different from a width of any other ones of the first driving electrodes, and the first sensing electrode comprises a plurality of first sensing electrodes and the second sensing electrode comprises a plurality of second sensing electrodes and a width of one of the first sensing electrodes adjacent to one of the second sensing electrodes is different from a width of any other ones of the first sensing electrodes.

9. The force sensor of claim 1, further comprising:
an insulating film covering a part of an upper surface and a part of a side surface of the second driving electrode and a part of an upper surface and a part of a side surface of the second sensing electrode,
wherein the second force sensing layer is on the insulating film, and is in contact with another part of the upper surface of the second driving electrode and another part of the upper surface of the second sensing electrode.

10. The force sensor of claim 9,
wherein the side surface of the second driving electrode and the side surface of the second sensing electrode face each other.

11. The force sensor of claim 1,
wherein each of a width of the first driving electrode and a width of the first sensing electrode is greater than each of a width of the second driving electrode and a width of the second sensing electrode.

12. The force sensor of claim 1, further comprising:
an insulating film covering the second driving electrode and the second sensing electrode,
wherein the second force sensing layer is on the insulating film, is in contact with the second driving electrode through a first contact hole penetrating the insulating film and exposing an upper surface of the second driving electrode, and is in contact with the second driving electrode through a second contact hole penetrating the insulating film and exposing the upper surface of the second sensing electrode.

13. The force sensor of claim 1, further comprising:
an insulating film covering the second force sensing layer on the second substrate,
wherein the second driving electrode and the second sensing electrode are on the insulating film,
the second driving electrode is in contact with the second force sensing layer through a first contact hole penetrating the insulating film and exposing the second force sensing layer, and
the second sensing electrode is in contact with the second force sensing layer through a second contact hole penetrating the insulating film and exposing the second force sensing layer.

14. The force sensor of claim 1,
wherein the first force sensing layer and the second force sensing layer include fine metal particles.

15. A force sensor, comprising:
a first substrate and a second substrate;
a first driving electrode, a second driving electrode, a first sensing electrode, and a second sensing electrode on one surface of the first substrate facing the second substrate;
a first force sensing layer on one surface of the second substrate facing the first substrate; and
a second force sensing layer laterally spaced apart from the first force sensing layer when viewed from a plan view and contacting the second driving electrode and the second sensing electrode regardless of whether a force is applied,
an insulating film covering a part of an upper surface of the second force sensing layer on the second substrate,
wherein the first force sensing layer overlaps the first driving electrode and the first sensing electrode, and gaps exist between the first force sensing layer and the first driving electrode and between the first force sensing layer and the first sensing electrode,
wherein the second driving electrode covers another part of the upper surface of the second force sensing layer, and
the second sensing electrode covers another part of the upper surface of the second force sensing layer.

16. The force sensor of claim 15,
wherein the second driving electrode covers a first side surface of the second force sensing layer, and the second sensing electrode covers a second side surface of the second force sensing layer.

17. The force sensor of claim 16,
wherein the first side surface and second side surface of the second force sensing layer face each other.

18. A display device, comprising:
a display panel; and
a force sensor under the display panel,
wherein the force sensor comprises:
a first substrate and a second substrate;
a first driving electrode, a second driving electrode, a first sensing electrode, and a second sensing electrode on one surface of the first substrate facing the second substrate;
a first force sensing layer on one surface of the second substrate facing the first substrate; and
a second force sensing layer laterally spaced apart from the first force sensing layer when viewed from a plan view and contacting the second driving electrode and the second sensing electrode regardless of whether a force is applied,
wherein the first force sensing layer overlaps the first driving electrode and the first sensing electrode, and gaps exist between the first force sensing layer and the first driving electrode and between the first force sensing layer and the first sensing electrode,
wherein the first force sensing layer contacts the first driving electrode and the first sensing electrode when the force is applied.

19. The display device of claim 18,
wherein the display panel comprises a panel protrusion portion protruding from one side surface thereof, and
the force sensor is on a lower surface of the panel protrusion portion.

20. The display device of claim 19, further comprising:
a cover window on the display panel and including a light transmitting portion corresponding to a display area of the display panel and a side light transmitting portion overlapping the panel protrusion portion.

* * * * *